(12) United States Patent
Yun et al.

(10) Patent No.: US 10,392,499 B2
(45) Date of Patent: Aug. 27, 2019

(54) INORGANIC FILLER, EPOXY RESIN COMPOSITION INCLUDING THE SAME AND LIGHT EMITTING ELEMENT INCLUDING INSULATING LAYER USING THE COMPOSITION

(71) Applicant: LG INNOTEK CO., LTD., Seoul (KR)

(72) Inventors: Sung Jin Yun, Seoul (KR); Jae Man Park, Seoul (KR); Hyun Gu Im, Seoul (KR); Jin A Gu, Seoul (KR); Gun Young Gil, Seoul (KR); Se Woong Na, Seoul (KR); Sang A Ju, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 127 days.

(21) Appl. No.: 15/320,132

(22) PCT Filed: Jun. 19, 2015

(86) PCT No.: PCT/KR2015/006230
§ 371 (c)(1),
(2) Date: Dec. 19, 2016

(87) PCT Pub. No.: WO2015/194901
PCT Pub. Date: Dec. 23, 2015

(65) Prior Publication Data
US 2017/0130033 A1 May 11, 2017

(30) Foreign Application Priority Data

Jun. 19, 2014 (KR) .................. 10-2014-0074874
Jul. 25, 2014 (KR) .................. 10-2014-0094762
(Continued)

(51) Int. Cl.
*C08K 9/02* (2006.01)
*C08K 3/22* (2006.01)
(Continued)

(52) U.S. Cl.
CPC ............ *C08K 9/02* (2013.01); *C01B 21/0648* (2013.01); *C01B 21/0728* (2013.01);
(Continued)

(58) Field of Classification Search
CPC .... C01B 21/0828; C01B 21/064-0648; C08K 9/02; C08K 3/38; C08K 2003/385;
(Continued)

(56) References Cited

U.S. PATENT DOCUMENTS

2011/0132644 A1 6/2011 Nishi et al.
2014/0349105 A1* 11/2014 Yamazaki .......... C08G 59/4042
428/323

FOREIGN PATENT DOCUMENTS

JP 2013-14671 A 1/2013
JP 2013-87191 A 5/2013
WO WO 2010/141432 A1 12/2010

OTHER PUBLICATIONS

L.T. Zhuravlev, "The Surface Chemistry of Amorphous Silica. Zhuravlev Model," Colloids and Surfaces A: Phys. & Eng. Aspects. 173, 1-38 (2000).*

(Continued)

*Primary Examiner* — Kregg T Brooks
(74) *Attorney, Agent, or Firm* — Birch, Stewart, Kolasch & Birch, LLP

(57) ABSTRACT

An inorganic filler included in an epoxy resin composition includes a coating layer formed on a surface thereof, and the surface of the coating layer includes at least two elements selected from the group consisting of C, N and O.

5 Claims, 9 Drawing Sheets

(30) Foreign Application Priority Data

Sep. 12, 2014 (KR) .................. 10-2014-0121058
Sep. 12, 2014 (KR) .................. 10-2014-0121059

(51) Int. Cl.

| | | |
|---|---|---|
| C08K 3/34 | (2006.01) | |
| C08K 3/38 | (2006.01) | |
| C08K 9/04 | (2006.01) | |
| C08K 3/04 | (2006.01) | |
| C08K 5/55 | (2006.01) | |
| C08K 9/06 | (2006.01) | |
| C08K 9/10 | (2006.01) | |
| C08L 63/00 | (2006.01) | |
| H05K 1/03 | (2006.01) | |
| C01B 21/064 | (2006.01) | |
| C08G 59/02 | (2006.01) | |
| C09C 1/00 | (2006.01) | |
| C09C 3/10 | (2006.01) | |
| C09C 3/12 | (2006.01) | |
| H01L 23/373 | (2006.01) | |
| H01L 33/52 | (2010.01) | |
| C01B 21/082 | (2006.01) | |
| C01B 21/072 | (2006.01) | |

(52) U.S. Cl.
CPC ............ *C01B 21/0828* (2013.01); *C08K 3/38* (2013.01); *C09C 1/00* (2013.01); *H05K 1/0373* (2013.01); *C08K 2003/385* (2013.01); *H05K 2201/0162* (2013.01)

(58) Field of Classification Search
CPC ............... C09C 1/00; C08L 63/00–10; C09D 163/00–10; C09J 163/00–10; C08J 2363/00–10; H05K 1/0373
See application file for complete search history.

(56) References Cited

OTHER PUBLICATIONS

Knovel Critical Tables, 2nd ed. (2008).*
Chiu et al., "Effect of pyrolysis atmospheres on the morphology of polymer-derived silicon oxynitrocarbide ceramic films coated aluminum nitride surface and the thermal conductivity of silicone rubber composites", Applid Surface Science, 2014, vol. 292, pp. 319-327, (Available online: Dec. 1, 2013), See abstract; left column, p. 319; Scheme 1.
Peng et al., "Electrical and thermophysical properties of epoxy/aluminum nitride nanocomposites: Effects of nanoparticle surface modification", Composites: Part A, 2010, vol. 41, pp. 1201-1209, See abstract.
Chiu et al., "Surface Modification of Aluminum Nitride by Polysilazane and its Polymer-Derived Amorphous Silicon Oxycarbide Ceramic for the Enhancement of Thermal Conductivity . . . ," Applied Surface Science, vol. 292, 2014 (published on web Dec. 21, 2013), XP028816366, pp. 928-936.
Database WPI Week 201333, "Polymer Nanocomposite Resin Composition Used for Cured Material for Manufacturing Semiconductor Module, Contains Thermosetting Resin, Curing Agent . . . ," Thomson Scientific, London, GB, AN 2013-H12454, XP002776587, 2 pages.
Hwang et al., "Silicon Carbonitride Covered SiC Composites for Enhanced Thermal Conductivity and Electrical Insulation," Applied Thermal Engineering, vol. 70, 2014 (published on web May 12, 2014), XP029011077, pp. 600-608.
Kim et al., "Chemically Modified Boron Nitride-Epoxy Terminated Dimethylsiloxane Composite for Improving the Thermal Conductivity," Ceramics International, vol. 40, 2014 (published on web Aug. 21, 2013), XP055197609, pp. 2047-2056.
Kim et al., "Fabrication of Thermally Conductive Composite with Surface Modified Nitride by Epoxy Wetting Method," Ceramics International, vol. 40, 2014 (published on web Oct. 26, 2013), XP028828772, pp. 5181-5189.

* cited by examiner

[Fig. 1]
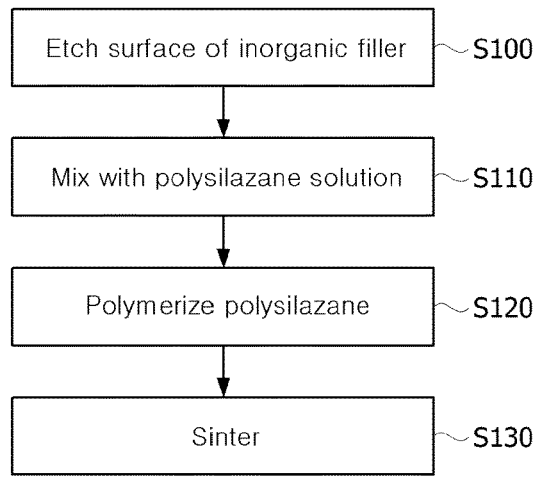
[Fig. 2]
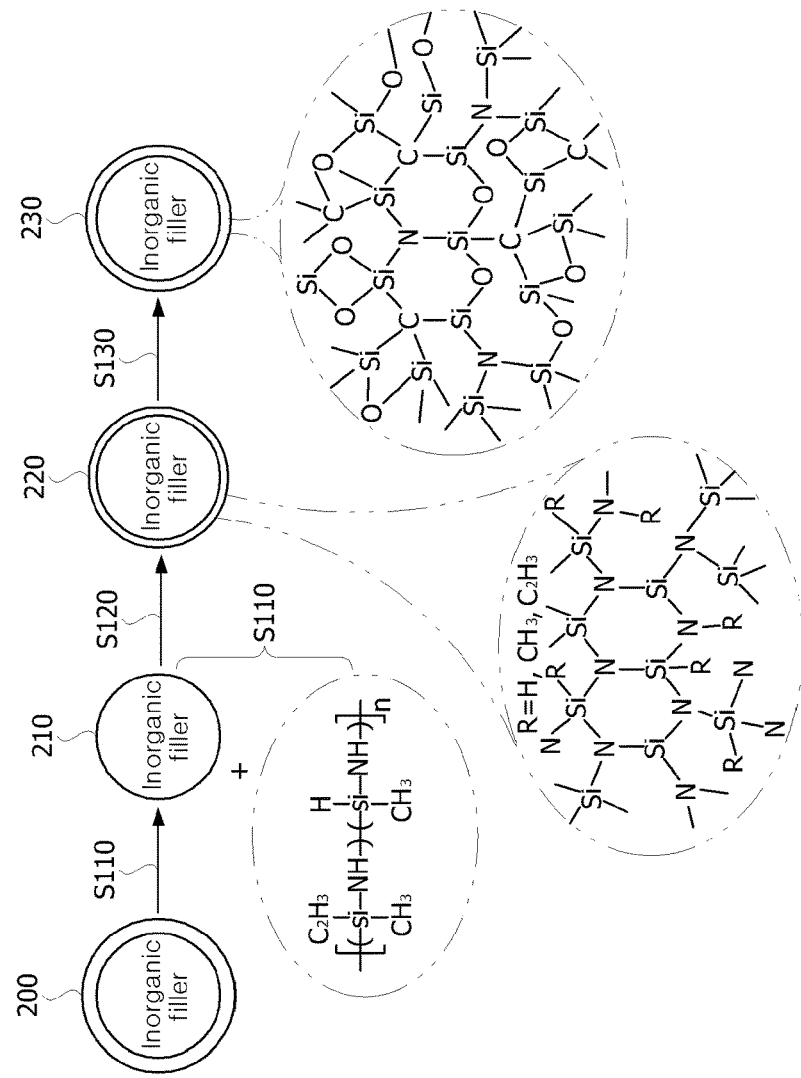

[Fig. 3]
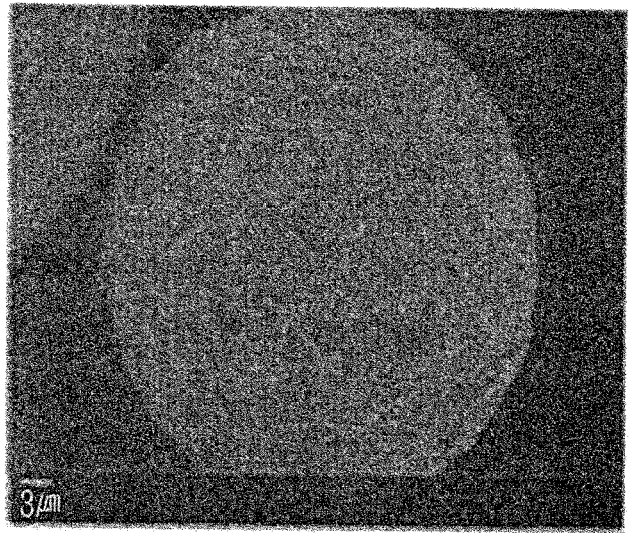
[Fig. 4]
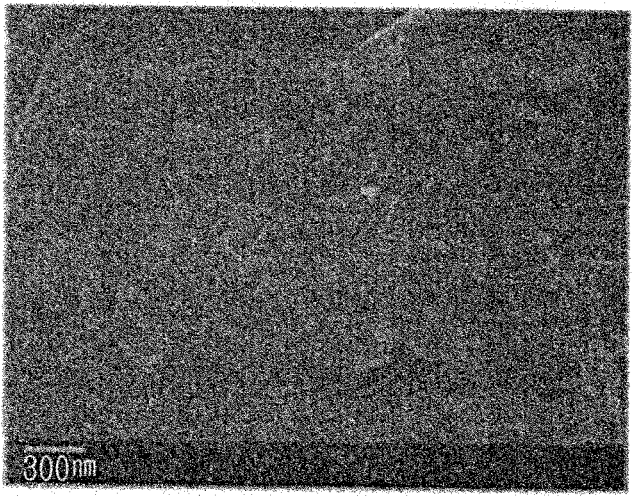
[Fig. 5]
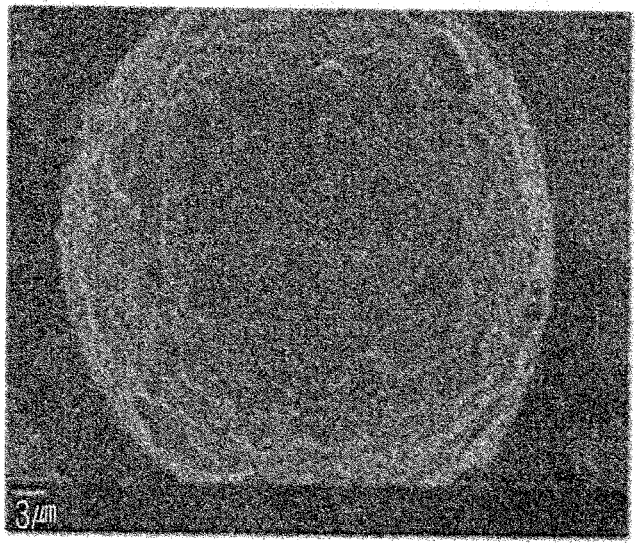

[Fig. 6]
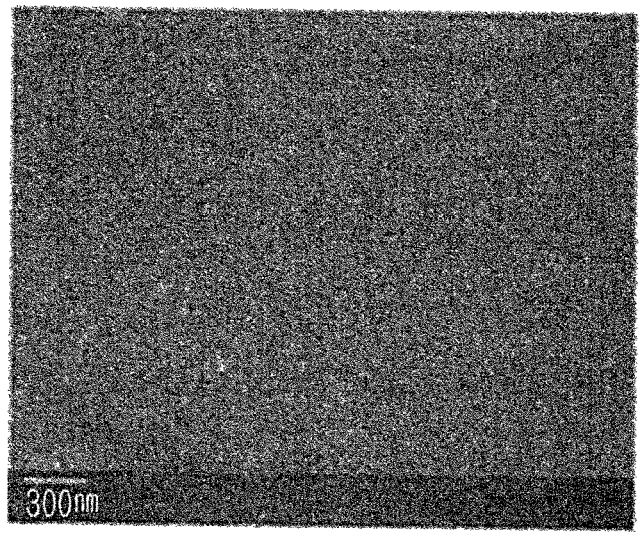
[Fig. 7]
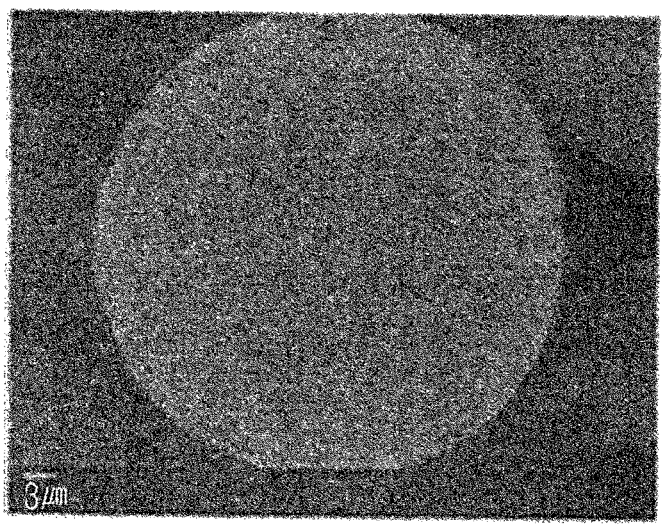
[Fig. 8]
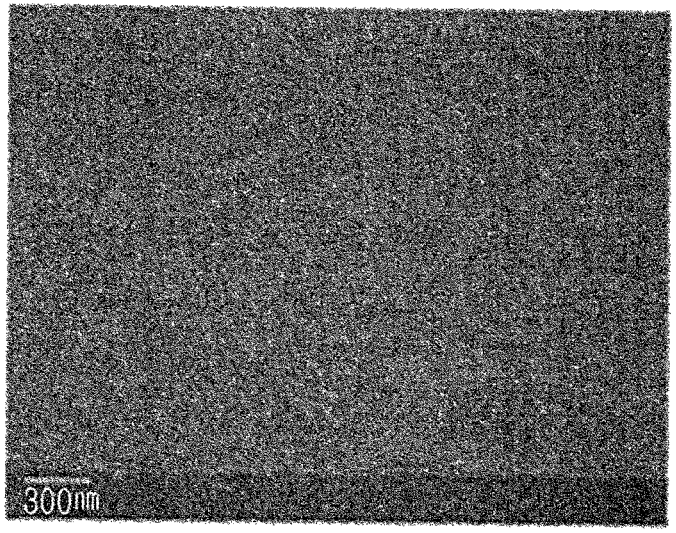

[Fig. 9]
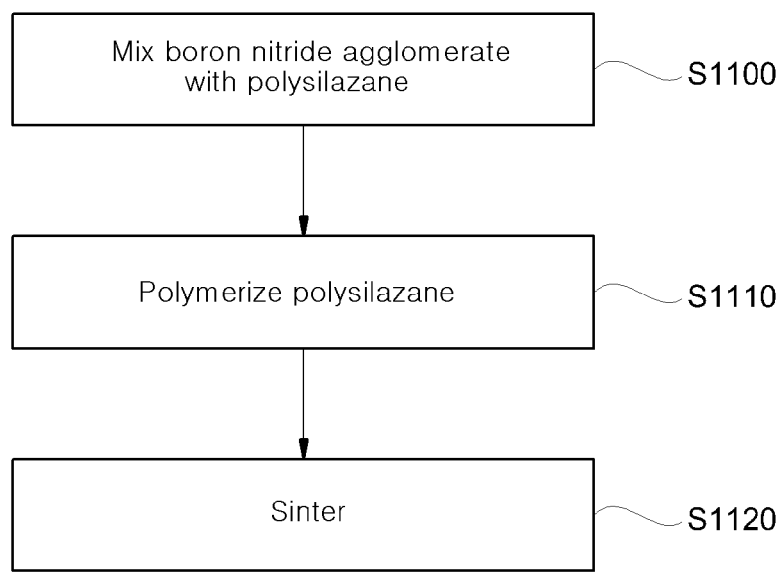

[Fig. 10]
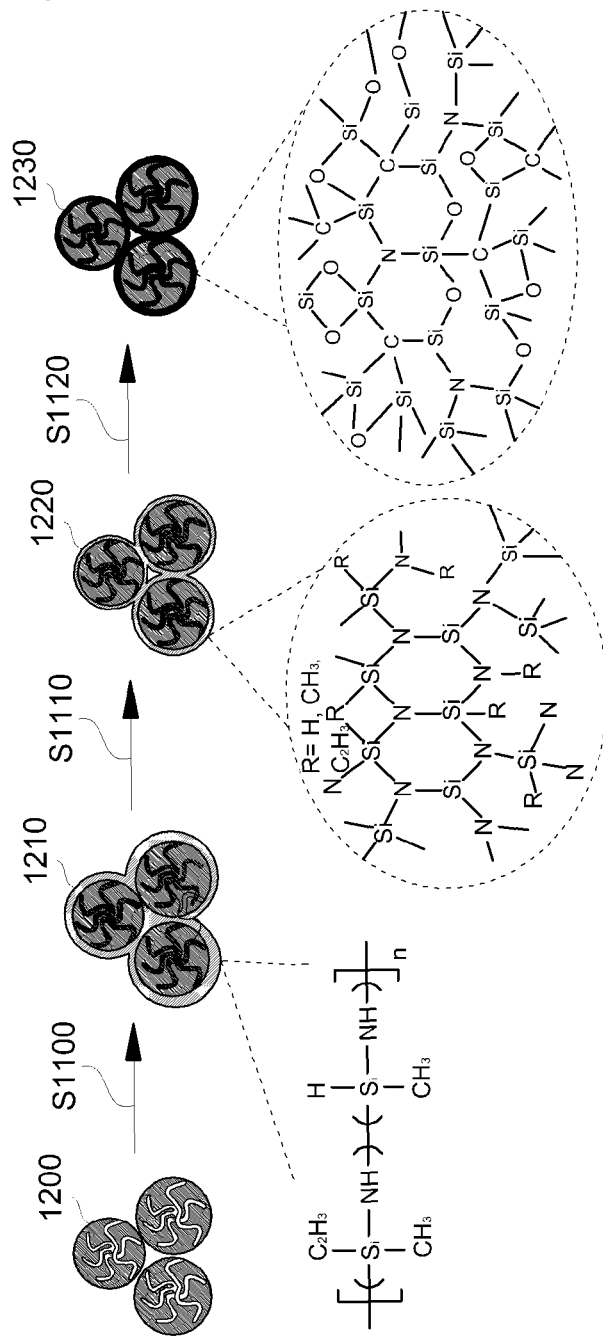

[Fig. 11]
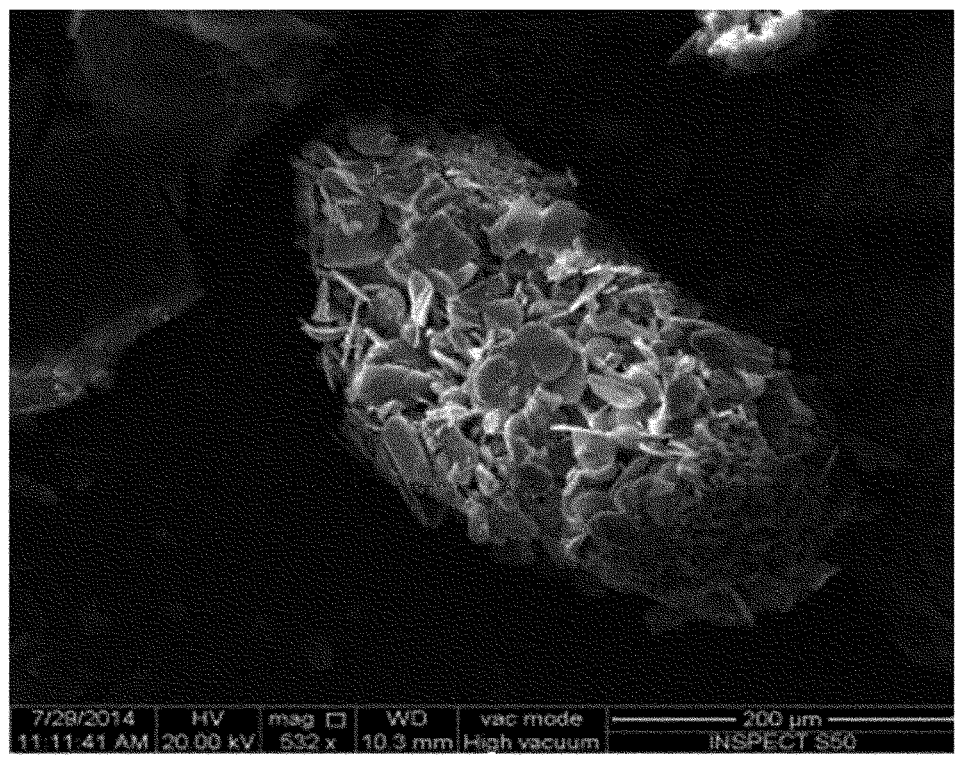
[Fig. 12]
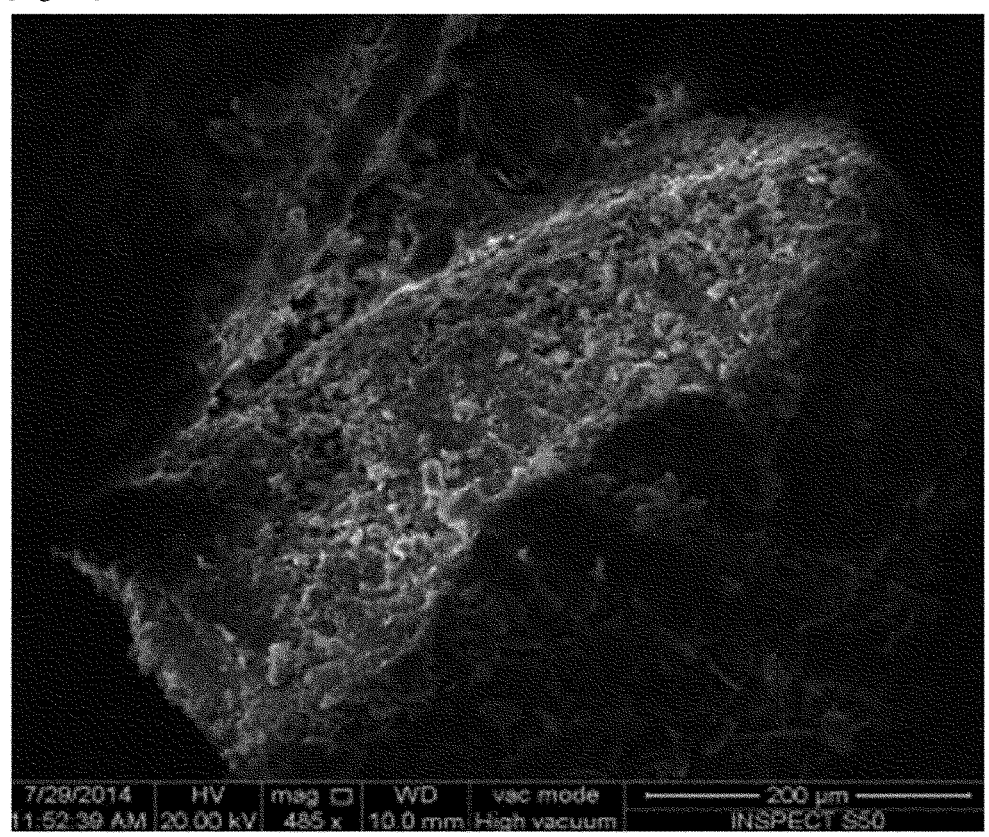

[Fig. 13]
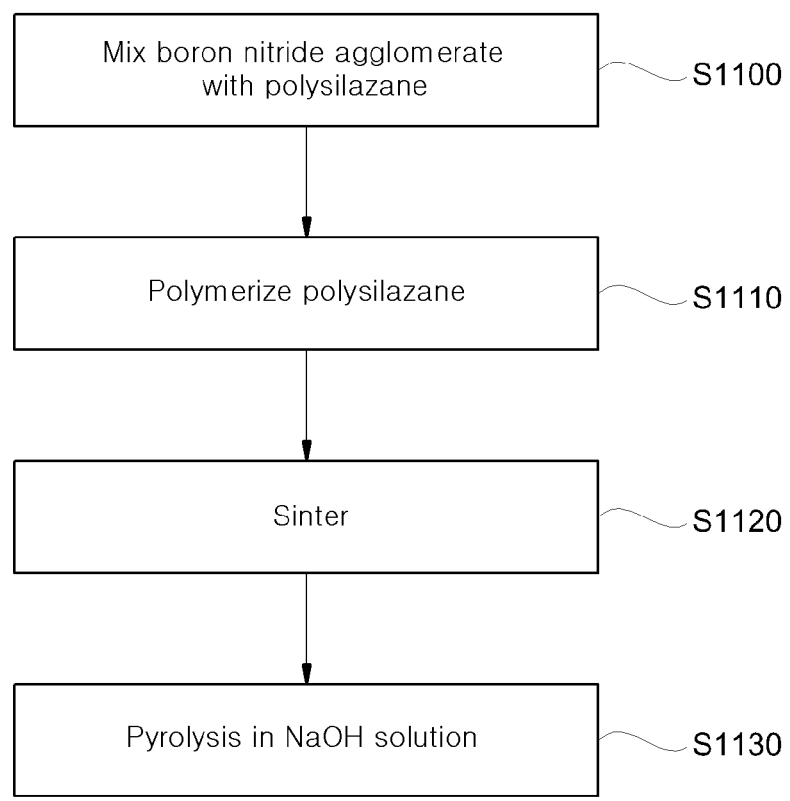

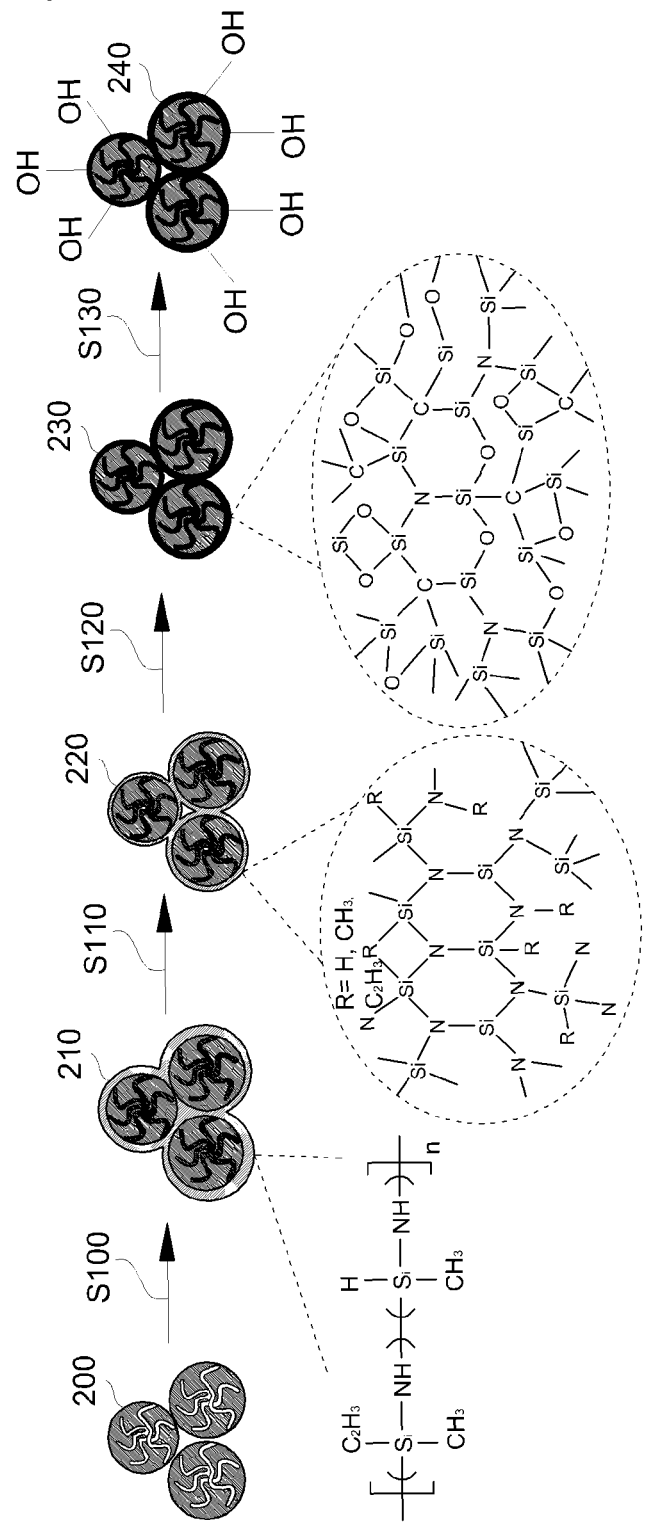

[Fig. 15]
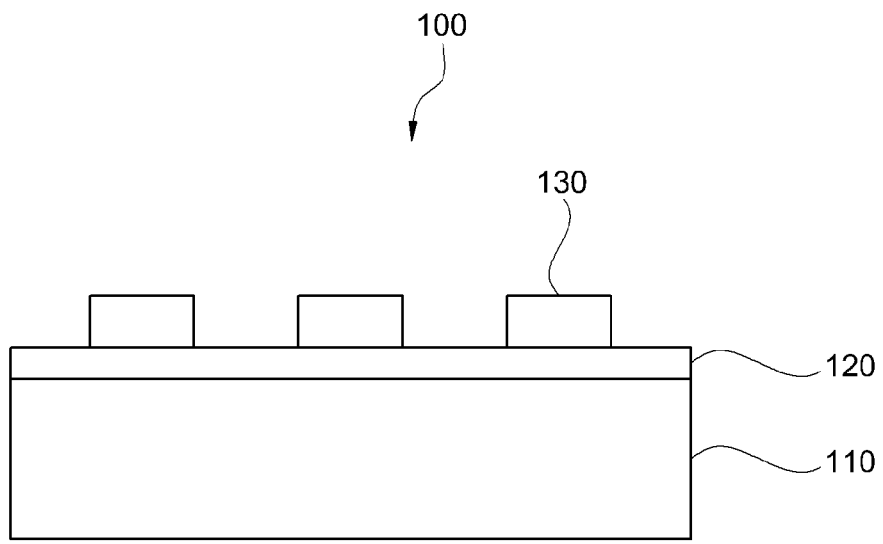
[Fig. 16]
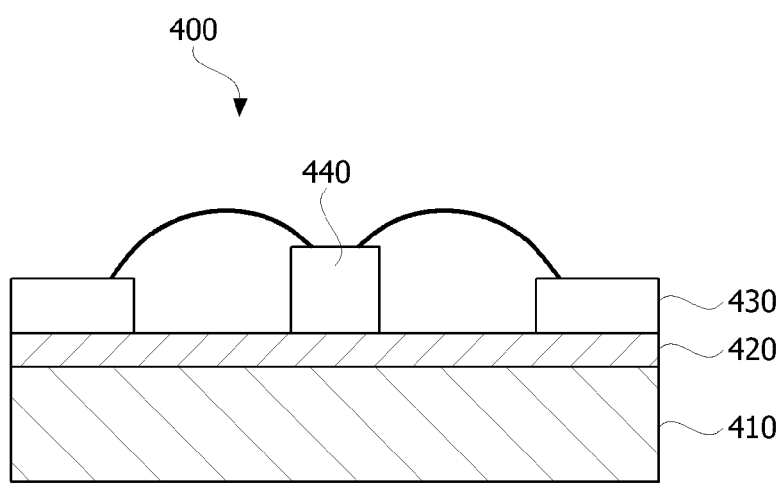

INORGANIC FILLER, EPOXY RESIN COMPOSITION INCLUDING THE SAME AND LIGHT EMITTING ELEMENT INCLUDING INSULATING LAYER USING THE COMPOSITION

CROSS REFERENCE TO RELATED APPLICATIONS

This application is the National Phase of PCT International Application No. PCT/KR2015/006230, filed on Jun. 19, 2015, which claims priority under 35 U.S.C. 119(a) to Patent Application Nos. 10-2014-0074874, filed in Republic of Korea on Jun. 19, 2014, 10-2014-0094762 filed in Republic of Korea on Jul. 25, 2014, 10-2014-0121059 filed in Republic of Korea on Sep. 12, 2014 and 10-2014-0121058 filed in Republic of Korea on Sep. 12, 2014, all of which are hereby expressly incorporated by reference into the present application.

TECHNICAL FIELD

The present invention relates to an inorganic filler, and more particularly, to an inorganic filler included in an epoxy resin composition.

BACKGROUND ART

A light emitting device including a light emitting element such as light emitting diode (LED) is used in various types of light sources. According to the development of semiconductor techniques, development of high-power light emitting elements is accelerating. To stably correspond to large amounts of light and heat emitted from such a light emitting element, radiating performance of the light emitting element is required.

In addition, according to the tendency of highly-integrated and high-power electronic parts, there is a growing attention for radiation of a printed circuit board on which electronic parts are mounted.

Generally, for an insulating layer of a light emitting element or printed circuit board, an epoxy resin composition including an epoxy compound, a curing agent and an inorganic filler may be used.

Here, the inorganic filler may include a ceramic-based inorganic filler such as boron nitride, silicon carbide, aluminum oxide, or aluminum nitride, or a carbon-based inorganic filler such as a carbon nanotube, graphite, or graphene. According to the type and content of the inorganic filler included in the epoxy resin composition, dispersity, insulability and thermal conductivity of the epoxy resin composition may be changed.

One of the inorganic fillers, boron nitride, while having a very high thermal conductivity, has a low wettability with the epoxy compound, a low dispersity, a low adhesive strength to a substrate, and a low processability.

In addition, planar boron nitride has an excellent thermal conductivity, but has an anisotropic thermal conductivity. To solve such a problem, an agglomerate of the planar boron nitrides may be used, but the thermal conductivity may be reduced due to a void in the agglomerate, and the agglomerate is easily breakable due to a weak binding strength between the planar boron nitrides.

DISCLOSURE OF INVENTION

Technical Problem

The present invention is directed to providing an inorganic filler included in an epoxy resin composition.

Solution to Problem

The inorganic filler according to an exemplary embodiment of the present invention includes a coating layer formed on a surface thereof, and the coating layer includes silicon oxycarbonitride (SiCNO).

The inorganic filler may include at least one of silicon carbide (SiC), boron nitride (BN), aluminum oxide ($Al_2O_3$) and aluminum nitride (AlN).

The coating layer formed on a surface of the silicon carbide may have a thickness of 50 to 200 nm.

The coating layer formed on a surface of the boron nitride may have a thickness of 50 to 150 nm.

The coating layer formed on a surface of the aluminum oxide may have a thickness of 10 to 100 nm.

The coating layer formed on a surface of the aluminum nitride may have a thickness of 40 to 150 nm.

The coating layer may be formed of polysilazane (PSZ).

The coating layer may be formed by polymerizing the polysilazane on the surface of the inorganic filler and sintering the polymerized product.

The epoxy resin composition according to an exemplary embodiment of the present invention includes an epoxy compound at 3 to 40 wt %, a curing agent at 0.5 to 10 wt %, and an inorganic filler at 50 to 95 wt %, and the inorganic filler includes boron nitride in which a surface is coated with a ceramic including at least two elements selected from the group consisting of C, N and O.

The ceramic may include silicon oxycarbonitride (SiCNO) or a metal oxide including an alkoxide group.

The metal oxide may include at least one of aluminum oxide, silicon oxide and titanium oxide.

The metal oxide may be formed of at least one of aluminum alkoxide, silicon alkoxide and titanium alkoxide.

The boron nitride may include an agglomerate in which planar boron nitrides agglomerate.

The boron nitride may be included at 30 to 39 wt % with respect to the epoxy resin composition.

The inorganic filler may further include at least one of aluminum oxide and aluminum nitride.

The aluminum nitride may be included at 7.4 to 9.7 parts by weight, and the aluminum oxide may be included at 5.6 to 7.4 parts by weight with respect to 10 parts by weight of the boron nitride.

The epoxy compound may include at least one of a crystalline epoxy compound, an amorphous epoxy compound and a silicon epoxy compound, and the curing agent may include at least one of an amine-based curing agent and an acid anhydride-based curing agent.

The epoxy resin composition may have a thermal conductivity of 14 W/mK or more, and a peel strength of 0.7 Kgf/cm or more.

The epoxy resin composition may have a thermal conductivity of 16 W/mK or more, and a peel strength of 1 Kgf/cm or more.

A printed circuit board according to an exemplary embodiment of the present invention includes a substrate, an insulating layer formed on the substrate, and a circuit pattern formed on the insulating layer, and the insulating layer includes an epoxy resin composition including an epoxy compound at 3 to 40 wt %, a curing agent at 0.5 to 10 wt %, and an inorganic filler at 50 to 95 wt %. Here, the inorganic filler includes boron nitride in which a surface is coated with a ceramic including at least two elements selected from the group consisting of C, N and O.

A light emitting element module according to an exemplary embodiment of the present invention includes a substrate, an insulating layer formed on the substrate, a circuit pattern formed on the insulating layer, and a light emitting element formed on the insulating layer, and the insulating layer includes an epoxy resin composition including an epoxy compound at 3 to 40 wt %, a curing agent at 0.5 to 10 wt %, and an inorganic filler at 50 to 95 wt %. Here, the inorganic filler includes boron nitride in which a surface is coated with a ceramic including at least two elements selected from the group consisting of C, N and O.

The inorganic filler according to an exemplary embodiment of the present invention includes an agglomerate in which planar inorganic particles agglomerate, and the ceramic including at least two elements selected from the group consisting of C, N and O is formed in a void in the agglomerate.

The planar inorganic particles may include at least one of graphite and boron nitride (BN).

The ceramic may include silicon oxycarbonitride (SiCNO) or silicon carbonitride (SiCN).

The silicon oxycarbonitride or the silicon carbonitride may be formed of polysilazane (PSZ).

The ceramic may include at least one of aluminum oxide, silicon oxide and titanium oxide, each of which includes an alkoxide group.

The alkoxide group may be selected from the group consisting of $C_1$–$C_6$ alkyls.

The ceramic may be formed of at least one of aluminum alkoxide, silicon alkoxide and titanium alkoxide.

The epoxy resin composition according to an exemplary embodiment of the present invention includes an epoxy compound, and an inorganic filler including an agglomerate in which planar inorganic particles agglomerate. Here, a ceramic including at least two elements selected from the group consisting of C, N and O is formed in a void in the agglomerate.

The agglomerate in which boron nitrides agglomerate may be included at 10 to 60 parts by volume with respect to 10 parts by volume of the epoxy compound.

The agglomerate in which boron nitrides agglomerate may be included at 15 to 55 parts by volume with respect to 10 parts by volume of the epoxy compound.

The agglomerate in which boron nitrides agglomerate may be included at 45 to 55 parts by volume with respect to 10 parts by volume of the epoxy compound.

The epoxy compound may include at least one selected from the group consisting of a crystalline epoxy compound, an amorphous epoxy compound and a silicon epoxy compound.

The light emitting element module according to an exemplary embodiment of the present invention includes a substrate, an insulating layer formed on the substrate, a circuit pattern formed on the insulating layer, and a light emitting element formed on the insulating layer, and the insulating layer includes an epoxy resin composition including an epoxy compound, and an inorganic filler including an agglomerate in which planar inorganic particles agglomerate. Here, a ceramic including at least two elements selected from the group consisting of C, N and O is formed in a void of the agglomerate.

The inorganic filler according to an exemplary embodiment of the present invention includes a coating layer formed on a surface thereof, the coating layer includes a ceramic including at least two elements selected from the group consisting of C, N and O, and a hydroxyl group (—OH) is formed on a surface of the coating layer.

The inorganic filler may include at least one of silicon carbide (SiC), boron nitride (BN), graphite, aluminum oxide ($Al_2O_3$) and aluminum nitride (AlN).

The ceramic may include silicon oxycarbonitride (SiCNO) or silicon carbonitride (SiCN).

The hydroxyl group may bind to Si of the silicon oxycarbonitride or the silicon carbonitride.

The inorganic filler may include an agglomerate in which planar inorganic particles agglomerate.

The inorganic particles may include at least one of boron nitride and graphite.

The ceramic may be filled in a void of the agglomerate.

The epoxy resin composition according to an exemplary embodiment of the present invention includes an epoxy compound, and an inorganic filler including a coating layer formed on a surface thereof. Here, the coating layer includes a ceramic including at least two elements selected from the group consisting of C, N and O, and a hydroxyl group (—OH) is formed on a surface of the coating layer.

The epoxy compound and the inorganic filler may be included at a volume ratio of 10:10 to 50.

The ceramic may include silicon oxycarbonitride (SiCNO) or silicon carbonitride (SiCN), and the hydroxyl group may bind to Si of the silicon oxycarbonitride or the silicon carbonitride.

Advantageous Effects of Invention

According to an exemplary embodiment of the present invention, an inorganic filler included in an epoxy resin composition applied to a printed circuit board or a light emitting element can be obtained. Accordingly, an epoxy resin composition having a good dispersity, excellent insulability, adhesive strength and processability, a high peel strength and a high thermal conductivity can be obtained, and a thermal radiation property and a reliability of the printed circuit board or light emitting element can be increased. In addition, an inorganic filler having an excellent isotropic thermal conductivity can be obtained.

BRIEF DESCRIPTION OF DRAWINGS

FIGS. 1 and 2 illustrate a method of coating a surface of an inorganic filler according to an exemplary embodiment of the present invention;

FIGS. 3 to 8 are scanning electron microscope (SEM) images illustrating coating of a surface of an inorganic filler stage by stage;

FIGS. 9 and 10 illustrate a method of filling a void of an agglomerate in which planar inorganic particles agglomerate with a ceramic according to an exemplary embodiment of the present invention;

FIG. 11 shows a morphology of a boron nitride agglomerate 1200;

FIG. 12 shows a morphology of a boron nitride agglomerate in which a void is filled with SiCNO;

FIGS. 13 and 14 illustrate a method of treating a surface of an inorganic filler according to an exemplary embodiment of the present invention;

FIG. 15 is a cross-sectional view of a printed circuit board according to an exemplary embodiment of the present invention; and FIG. 16 is a cross-sectional view of a light emitting element module according to an exemplary embodiment of the present invention.

MODE FOR THE INVENTION

The present invention can be modified and implemented in various forms, and therefore, only specific embodiments will be described in detail. However, the present invention is not limited to specific disclosures, and it should be understood that the present invention includes all modifications, equivalents and alternatives included in the technical idea and scope of the present invention.

The terms "first" and "second" may be used to explain various components, but the components should not be limited by these terms. The terms are used only to distinguish one component from another component. For example, without departing from the scope of the present invention, a first component may be called a second component, and similarly, a second component may be called a first component. The term "and/or" includes any one of a plurality of the related items described herein or a combination thereof.

The terms used in the present invention are used only to explain specific examples, not to limit the present invention. Singular expressions includes plural referents unless clearly indicated otherwise in the context. The terms "include" and "have" used herein designate the presence of characteristics, numbers, steps, operations, components, parts or a combination thereof described in the specification, and do not imply that the possibility of the presence or addition of one or more other characteristics, numbers, steps, operations, components, parts or a combination thereof is excluded in advance.

All terms including technical and scientific terms have the same meaning that is generally understood by those skilled in the art unless defined otherwise. General terms, such as terms defined in dictionaries, should be interpreted with meanings according to the context of related technology, and should not be interpreted with ideal or excessively formal meanings unless they are clearly defined thus in the present invention.

When a part such as a layer, a film, a region, or a plate is present "on" the other part, it means that the part is present "right on" the other part, and also mean that a third part is present between them. Contrarily, when a part is present "right on" the other part, it means that there is nothing between them.

Hereinafter, the exemplary embodiments will be described in detail with reference to the accompanying drawings, but like numerals denote like or corresponding components regardless of marks of the drawings, and duplicated descriptions thereof will be omitted.

In the specification, wt % may be replaced with parts by weight.

I. Inorganic Filler in which Coating Layer is Formed

An epoxy resin composition according to an exemplary embodiment of the present invention includes an epoxy compound, a curing agent, and an inorganic filler in which a surface is coated with a ceramic including at least two elements selected from the group consisting of C, N and O.

The inorganic filler according to an exemplary embodiment of the present invention includes a coating layer formed on a surface thereof, and the coating layer includes a ceramic including at least two elements selected from the group consisting of C, N and O, for example, silicon oxycarbonitride (SiCNO). When the surface of the inorganic filler is coated with SiCNO, a wettability with an epoxy compound increases, and thus dispersity, insulability and thermal conductivity may increase.

Here, the inorganic filler may include at least one of silicon carbide (SiC), boron nitride (BN), aluminum oxide ($Al_2O_3$) and aluminum nitride (AlN), and may be spherical.

In addition, the coating layer may be formed of polysilazane (PSZ) of Formula 1.

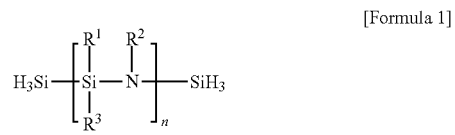

[Formula 1]

Here, each of $R^1$, $R^2$ and $R^3$ may be selected from the group consisting of H, $C_1$~$C_3$ alkyl, $C_2$~$C_3$ alkene and $C_2$~$C_3$ alkyne, and n is a positive integer.

FIGS. 1 and 2 illustrate a method of coating a surface of an inorganic filler according to an exemplary embodiment of the present invention.

Referring to FIGS. 1 and 2, etching is performed on a surface of an inorganic filler 200, for example, silicon carbide (SiC), boron nitride (BN), aluminum oxide ($Al_2O_3$) and aluminum nitride (AlN) (S100). Here, the silicon carbide, boron nitride, aluminum oxide and aluminum nitride may be spherical or planar. Here, etching may be performed using a hydrogen fluoride (HF)-based solution. When the surface of the inorganic filler is etched, reactivity with polysilazane may increase.

In addition, an etched inorganic filler 210 is mixed with a polysilazane solution (S110). Here, the polysilazane solution is a polysilazane monomer diluted in a solvent. A dilution ratio of the polysilazane and the solvent may be at a weight ratio of, for example, 10:90, but the present invention is not limited. The dilution ratio of the polysilazane and the solvent may be dependent on a coating thickness.

In addition, the polysilazane is polymerized on the surface of the inorganic filler 210 (S120). To this end, the inorganic filler 210 and the polysilazane solution may be mixed, and then treated at 160° C. for 18 hours. Accordingly, a polysilazane monomer may be crosslinked, and the polymerized polysilazane may be coated on the surface of an inorganic filler 220.

In addition, the polysilazane-coated inorganic filler is sintered (S130). To this end, the inorganic filler 220 may be pyrolyzed at 800° C. for 3 hours. Through the pyrolysis, an inorganic filler 230 emitting $CH_4$, $C_2H_4$, $C_2H_6$ and $NH_3$ of a polysilazane polymer, and having an SiCNO ceramic coating layer on its surface may be obtained.

FIGS. 3 to 8 are SEM images illustrating coating of a surface of an inorganic filler stage by stage. FIGS. 3 and 4 show an untreated surface of silicon carbide. FIGS. 5 and 6 show a surface of silicon carbide coated with a polysilazane polymer. In addition, FIGS. 7 and 8 show a surface of silicon carbide coated with SiCNO.

Referring to FIGS. 7 and 8, it can be noted that the surface of the inorganic filler is uniformly coated, compared to that shown in FIGS. 5 and 6 coated with the polysilazane polymer.

Hereinafter, results of measuring the dispersity, insulability and thermal conductivity of the inorganic filler according to an exemplary embodiment of the present invention will be described.

First, the results of measuring the dispersity by changing the type and coating thickness of the inorganic filler will be described. The coating thickness may be controlled according to the dilution ratio of the polysilazane and the solvent used in S110 of FIG. 1.

According to the methods shown in FIGS. 1 and 2, 5 g each of the silicon carbide, boron nitride, aluminum oxide and aluminum nitride having an SiCNO coating layer formed on its surface is dispersed in 20 g of methyl ethyl ketone (MEK), and then the dispersity is observed for 24 hours.

TABLE 1

| Inorganic filler | 0 nm | 5 nm | 10 nm | 20 nm | 40 nm | 50 nm | 100 nm | 200 nm |
|---|---|---|---|---|---|---|---|---|
| Silicon carbide | X | X | X | X | P | P | P | P |
| Boron nitride | X | X | X | X | X | P | P | P |
| Aluminum oxide | P | P | P | P | P | P | P | P |
| Aluminum nitride | X | X | X | P | P | P | P | P |

Referring to Table 1, it can be noted that, when a thickness of the SiCNO coating layer formed on the surface of the silicon carbide is 40 nm or more, a good dispersity is obtained, and when the thickness of the SiCNO coating layer formed on the surface of the boron nitride is 50 nm or more, a good dispersity is obtained. In addition, it can be noted that, when the thickness of the SiCNO coating layer formed on the surface of the aluminum nitride is 20 nm or more, a good dispersity is obtained. When the inorganic filler has a good dispersity, the epoxy resin composition having a uniform quality may be obtained.

Afterward, the results of measuring electric conductivity and thermal conductivity according to the type and coating thickness of the inorganic filler will be described.

To this end, epoxy resin compositions are prepared with various types and coating thicknesses of inorganic fillers. First, to prepare an epoxy resin composition, 5 g of a crystalline epoxy compound (4,4'-biphenol ether diglycidyl ether), 2.5 g of an amorphous epoxy compound of Formula 2, 2.5 g of a silicon epoxy compound of Formula 3, 1.25 g of 4,4'-diaminodiphenylsulfone and 1.25 g of an acid anhydride-based curing agent of Formula 4 are mixed and dissolved in 30 g of MEK for 20 minutes.

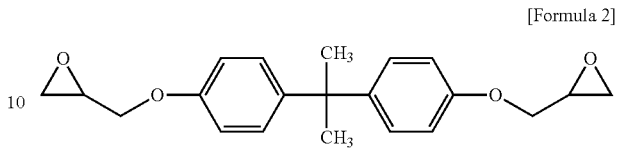

[Formula 2]

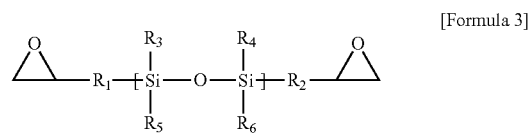

[Formula 3]

Here, $R^1$ to $R^6$ may be each selected from the group consisting of H, Cl, Br, F, $C_1$~$C_3$ alkyl, $C_1$~$C_3$ alkene, $C_1$~$C_3$ alkyne, and an aryl group.

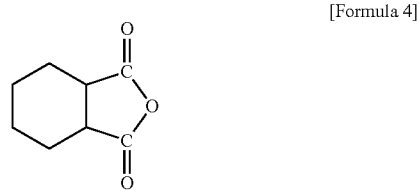 [SMILES: O=C1OC(=O)C2CCCCC12]

[Formula 4]

In addition, different types of inorganic fillers are each added to a transparent solution in which dissolution is completed to have different thicknesses, and stirred for 2 hours. The solution in which the stirring was completed is uniformly coated on a copper plate, and cured with a constant pressure at 150° C. for one and a half hours, and then electric conductivity and thermal conductivity are measured.

Table 2 shows the result of measuring an electric conductivity, and Table 3 shows the result of measuring a thermal conductivity. In Table 3, the unit of the thermal conductivity is W/mK.

TABLE 2

| Inorganic filler | 0 nm | 5 nm | 10 nm | 20 nm | 40 nm | 50 nm | 100 nm | 200 nm |
|---|---|---|---|---|---|---|---|---|
| Silicon carbide | $0.1e^{-1}$ | $1.1e^{-1}$ | $2.8e^{-2}$ | $7.8e^{-5}$ | $0.4e^{-7}$ | overflow | overflow | overflow |
| Boron nitride | $3.6e^{-7}$ | $1.7e^{-8}$ | $3.2e^{-8}$ | $4.5e^{-9}$ | overflow | overflow | overflow | overflow |
| Aluminum oxide | overflow | overflow | overflow | overflow | overflow | overflow | overflow | overflow |
| Aluminum nitride | $2.5e^{-7}$ | $4.5e^{-8}$ | $8.5e^{-8}$ | $3.1e^{-9}$ | overflow | overflow | overflow | overflow |

TABLE 3

| Inorganic filler | 0 nm | 5 nm | 10 nm | 20 nm | 40 nm | 50 nm | 70 nm | 100 nm | 150 nm |
|---|---|---|---|---|---|---|---|---|---|
| Silicon carbide | 7.09 | 9.22 | 9.55 | 9.91 | 10.37 | 11.90 | 12.55 | 13.63 | 11.12 |
| Boron nitride | 12.55 | 15.10 | 15.89 | 15.91 | 15.96 | 16.45 | 16.36 | 16.06 | 15.63 |
| Aluminum oxide | 6.31 | 8.47 | 9.60 | 9.81 | 9.95 | 10.01 | 9.97 | 9.33 | 8.81 |
| Aluminum nitride | 7.11 | 10.06 | 11.06 | 11.11 | 11.27 | 12.38 | 12.09 | 12.16 | 11.24 |

Referring to Table 2, when the thickness of the SiCNO coating layer formed on the surface of the silicon carbide is 50 nm or more, or the thickness of the SiCNO coating layer formed on the surface of the boron nitride is 40 nm or more, the inorganic filler may have an insulability suitable to be used as an insulating layer. In addition, it can be noted that, when the thickness of the SiCNO coating layer formed on the surface of the aluminum nitride is 40 nm or more, the inorganic filler may have an insulability suitable to be used as an insulating layer.

Referring to Table 3, it can be noted that, when the SiCON coating layer is formed on the surface of the inorganic filler, the thermal conductivity considerably increases compared to that of the inorganic filler (0 nm) having no coating layer.

According to the types of the inorganic fillers, it can be noted that, when the thickness of the SiCNO coating layer formed on the surface of the silicon carbide is 40 to 200 nm, the inorganic filler has a thermal conductivity of 10 W/mK or more, and when the thickness of the SiCNO coating layer formed on the surface of the silicon carbide is 50 to 150 nm, the inorganic filler has a thermal conductivity of 11 W/mK or more.

In addition, it can be noted that, when the thickness of the SiCNO coating layer formed on the surface of the boron nitride is 5 to 150 nm, the inorganic filler has a thermal conductivity of 15 W/mK or more, and when the thickness of the SiCNO coating layer formed on the surface of the boron nitride is 50 to 100 nm, the inorganic filler has a thermal conductivity of 16 W/mK or more.

In addition, it can be noted that, when the thickness of the SiCNO coating layer formed on the surface of the aluminum oxide is 10 to 100 nm, the inorganic filler has a thermal conductivity of 9 W/mK or more.

In addition, it can be noted that, when the thickness of the SiCNO coating layer formed on the surface of the aluminum nitride is 10 to 150 nm, the inorganic filler has a thermal conductivity of 11 W/mK or more, and when the thickness of the SiCNO coating layer formed on the surface of the aluminum nitride is 50 to 100 nm, the inorganic filler has a thermal conductivity of 12 W/mK or more.

According to a comprehensive analysis of the results of measuring dispersity, insulability and thermal conductivity shown in Tables 1 to 3, the thickness of the coating layer formed on the surface of the silicon carbide may be 50 to 200 nm, and preferably, 50 to 150 nm. The thickness of the coating layer formed on the surface of the boron nitride may be 50 to 150 nm, and preferably, 50 to 100 nm. The thickness of the coating layer formed on the surface of the aluminum oxide may be 10 to 100 nm, and preferably, 50 to 60 nm. In addition, the thickness of the coating layer formed on the surface of the aluminum nitride may be 40 to 150 nm, and preferably, 50 to 100 nm.

II. Epoxy Resin Composition Including Inorganic Filler in which Coating Layer is Formed Hereinafter, an epoxy resin composition including an inorganic filler according to an exemplary embodiment of the present invention will be described in detail.

The epoxy resin composition according to the exemplary embodiment of the present invention includes an epoxy compound, a curing agent, and an inorganic filler including boron nitride in which a surface is coated with a ceramic including at least two elements selected from the group consisting of C, N and O. Here, R may be selected from the group consisting of $C_1$~$C_6$ alkyls.

More particularly, the epoxy resin composition according to the exemplary embodiment of the present invention may include an epoxy compound at 3 to 40 wt %, preferably, 3 to 20 wt %, and more preferably, 9 to 18 wt %, a curing agent at 0.5 to 10 wt %, preferably, 0.5 to 5 wt %, and more preferably, 0.5 to 2 wt %, and an inorganic filler including boron nitride in which a surface is coated with a ceramic including at least two elements selected from the group consisting of C, N and O at 50 to 95 wt %, preferably, 75 to 95 wt %, and more preferably, 81 to 90 wt %.

When the epoxy resin composition includes an epoxy compound at 3 to 40 wt %, preferably 3 to 20 wt %, and more preferably, 9 to 18 wt %, due to a good hardness, an excellent cohesive property is obtained, and the thickness is easily controlled. In addition, when the epoxy resin composition includes the curing agent at 0.5 to 10 wt %, preferably 0.5 to 5 wt %, and more preferably 0.5 to 2 wt %, curing is easily performed, and due to a good hardness, an excellent cohesive property is obtained. In addition, when the epoxy resin composition includes an inorganic filler including boron nitride in which a surface is coated with a ceramic including at least two elements selected from the group consisting of C, N and O at 50 to 95 wt %, preferably 75 to 95 wt %, and more preferably, 81 to 90 wt %, excellent adhesive strength and thermal conductivity and a low electric conductivity are obtained, and a low thermal expansion property, a high thermal resistance and an excellent moldability are also obtained.

Here, the epoxy compound may include at least one of a crystalline epoxy compound, an amorphous epoxy compound and a silicon epoxy compound.

The crystalline epoxy compound may include a mesogen structure. The mesogen is a basic unit of a liquid crystal, and includes a rigid structure.

The mesogen may include one of the rigid structures shown in, for example, (a) to (e).

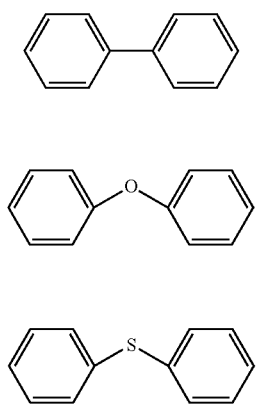

(a)

(b)

(c)

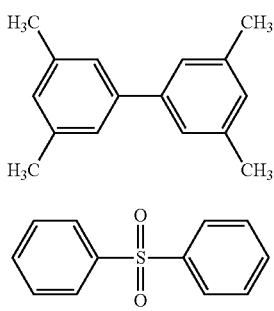

(d)

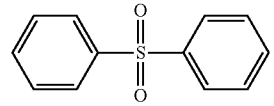

(e)

The crystalline epoxy compound including the mesogen structure may include, but is not limited to, for example, 4,4'-biphenolether diglycidyl ether, that is, SE-4280.

According to an exemplary embodiment of the present invention, the crystalline epoxy compound may include at least one of the compounds shown in, for example, Formulas 5 to 16.

[Formula 5]

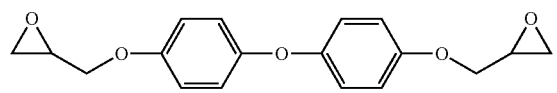

[Formula 6]

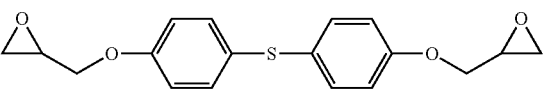

[Formula 7]

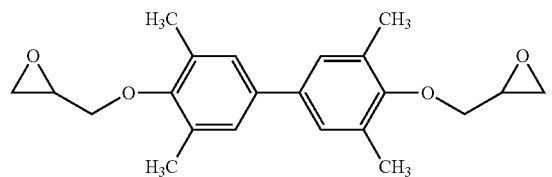

[Formula 8]

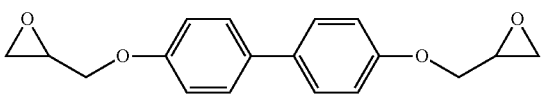

[Formula 9]

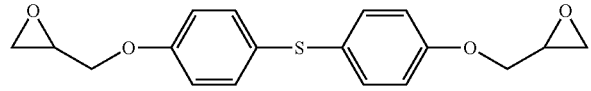

[Formula 10]

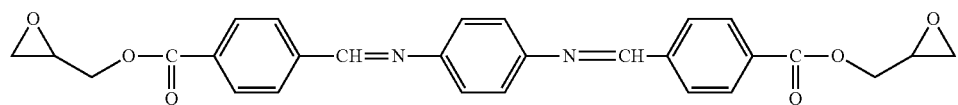

[Formula 11]

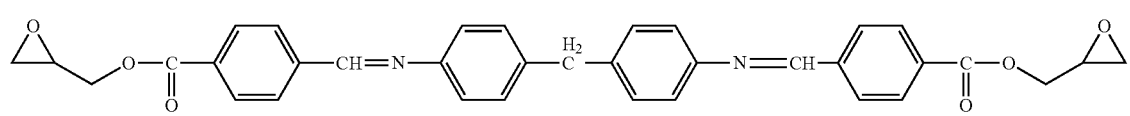

[Formula 12]

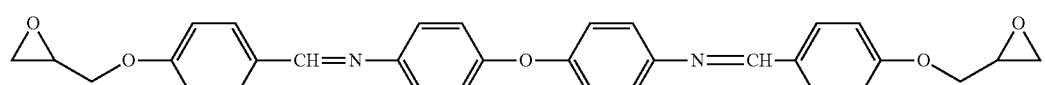

[Formula 13]

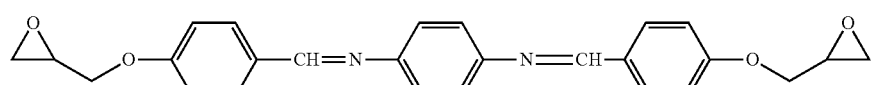

[Formula 14]

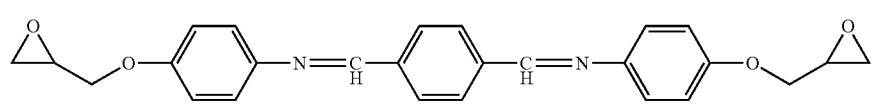

-continued

[Formula 15]

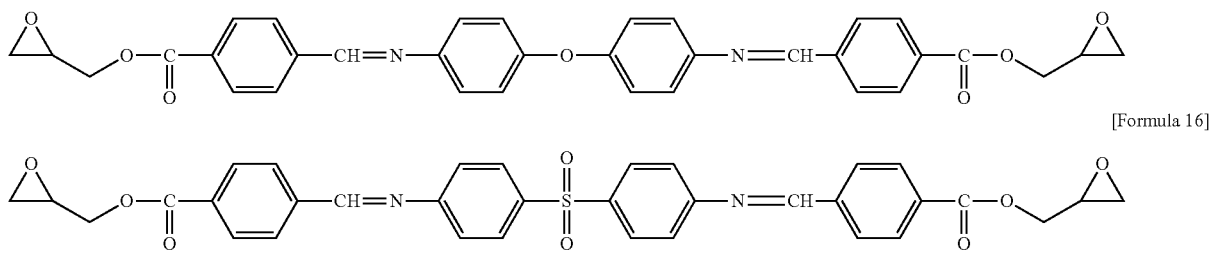

[Formula 16]

In addition, the epoxy resin composition according to an exemplary embodiment of the present invention may further include an amorphous epoxy compound. The amorphous epoxy compound may be included at 3 to 40 parts by weight with respect to 10 parts by weight of the crystalline epoxy compound. When the crystalline epoxy compound and the amorphous epoxy compound are included at the above ratio, a room temperature stability may increase.

The amorphous epoxy compound may be a conventional amorphous epoxy compound having at least two epoxy groups in a molecule.

The amorphous epoxy compound may be a glycidyl ether compound derived from one of dihydric phenols such as bisphenol A, bisphenol F, 3,3',5,5'-tetramethyl-4,4'-dihydroxydiphenylmethane, 4,4'-dihydroxydiphenylsulfone, 4,4'-dihydroxydiphenylsulfide, 4,4'-dihydroxydiphenylketone, fluorenebisphenol, 4,4'-biphenol,3,3',5,5'-tetramethyl-4,4'-dihydroxybiphenyl, 2,2'-biphenol, resorcin, catechol, t-butylcatechol, hydroquinone, t-butylhydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, allylated bisphenol A, allylated bisphenol F and allylated phenol novolac, trihydric or higher phenols such as phenol novolac, bisphenol A novolac, o-cresol novolac, m-cresol novolac, p-cresol novolac, xylenol novolac, poly-p-hydroxystyrene, tris-(4-hydroxyphenyl)methane, 1,1,2,2-tetrakis(4-hydroxyphenyl) ethane, fluoroglycinol, pyrogallol, t-butylpyrogallol, allylated pyrogallol, polyallylated pyrogallol, 1,2,4-benzenetriol, 2,3,4-trihydroxybenzophenone, a phenol aralkyl resin, a naphthol aralkyl resin and a dicyclopentadiene-based resin, halogenated bisphenols such as tetrabromobisphenol A and a mixture thereof.

An example of the bisphenol A-type epoxy compound is shown in Formula 2.

[Formula 2]

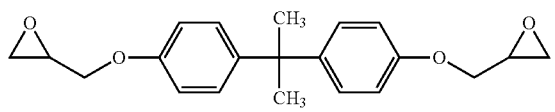

In addition, the epoxy resin composition according to an exemplary embodiment of the present invention may further include a silicon epoxy compound. The silicon epoxy compound may be included at 3 to 40 parts by weight with respect to 10 parts by weight of the crystalline epoxy compound. When the crystalline epoxy compound and the silicon epoxy compound are included at the above ratio, a thermal conductivity and a thermal resistance may increase.

An example of the silicon epoxy compound is shown in Formula 3.

[Formula 3]

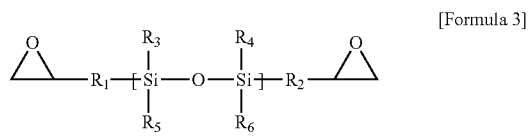

Here, $R^1$ to $R^6$ may be each selected from the group consisting of H, Cl, Br, F, $C_1$~$C_3$ alkyl, $C_2$~$C_3$ alkene, $C_2$~$C_3$ alkyne, and an aryl group.

In addition, the curing agent included in the epoxy resin composition according to an exemplary embodiment of the present invention may include at least one of an amine-based curing agent, a phenol-based curing agent, an acid anhydride-based curing agent, a polymercaptan-based curing agent, a polyaminoamide-based curing agent, an isocyanate-based curing agent and a block isocyanate-based curing agent.

The amine-based curing agent may be, for example, 4,4'-diamino diphenyl sulfone. Formula 17 shows an example of diamino diphenyl sulfone.

[Formula 17]

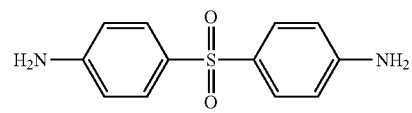

Other examples of the amine-based curing agent may include aliphatic amines, polyether polyamines, alicyclic amines, and aromatic amines. As the aliphatic amine, ethylenediamine, 1,3-diaminopropane, 1,4-diaminopropane, hexamethylenediamine, 2,5-dimethylhexamethylenediamine, trimethylhexamethylenediamine, diethylene-triamine, iminobispropylamine, bis(hexamethylene)triamine, triethylenetetramine, tetraethylenepentamine, pentaethylenehexamine, N-hydroxyethylethylenediamine, or tetra(hydroxyethyl)ethylenediamine may be used. The polyether polyamine may be one of triethyleneglycoldiamine, tetraethyleneglycoldiamine, diethyleneglycolbis(propylamine), polyoxypropylenediamine, polyoxypropylenetriamine and a mixture thereof. As the alicyclic amine, isophoronediamine, metacendiamine, N-aminoethylpiperazine, bis(4-amino-3-methyldicyclohexyl)methane, bis(aminomethyl)cyclohexane, 3,9-bis(3-aminopropyl)2,4,8,10-tetraoxaspiro(5,5)undecane or norbornene diamine may be used. The aromatic amine may be one of tetrachloro-p-xylylenediamine, m-xylylenediamine, p-xylylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane, α,α'-bis(4-aminophenyl)-p-diisopropylbenzene and a mixture thereof.

The phenol-based curing agent may be, for example, one of bisphenol A, bisphenol F, 4,4'-dihydroxydiphenylmethane, 4,4'-dihydroxydiphenylether, 1,4-bis(4-hydroxyphenoxy)benzene, 1,3-bis(4-hydroxyphenoxy)benzene, 4,4'-dihydroxydiphenylsulfide, 4,4'-dihydroxydiphenylketone, 4,4'-dihydroxydiphenylsulfone, 4,4'-dihydroxydiphenylester, 4,4'-dihydroxybiphenyl, 2,2'-dihydroxybiphenyl, 10-(2,5-dihydroxyphenyl)-10H-9-oxa-10-phosphaphenanthrene-10-oxide, phenol novolac, bisphenol A novolac, o-cresol novolac, m-cresol novolac, p-cresol novolac, xylenol novolac, poly-p-hydroxystyrene, hydroquinone, resorcin, catechol, t-butylcatechol, t-butylhydroquinone, fluoroglycinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, allylated bisphenol A, allylated bisphenol F, allylated phenol novolac, allylated pyrogallol, and a mixture thereof.

The acid anhydride-based curing agent may include, for example, a compound of Formula 4.

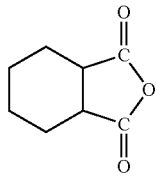

[Formula 4]

In addition, the acid anhydride-based curing agent may be, for example, one of dodecenyl succinic anhydride, poly(adipic anhydride), poly(azelaic anhydride), poly(sebacic anhydride), poly(ethyloctadecanedioic acid)anhydride, poly(phenylhexadecanedioic acid)anhydride, methyltetrahydrophthalic anhydride, methylhexahydrophthalic anhydride, hexahydrophthalic anhydride, methylhimic anhydride, tetrahydrophthalic anhydride, trialkyltetrahydrophthalic anhydride, methyl-cyclohexenedicarboxylic anhydride, methylcyclohexenetetracarboxylic anhydride, phthalic anhydride, trimellitic anhydride, pyromellitic anhydride, benzophenonete-tracarboxylic anhydride, ethyleneglycolbistrimellitate, chlorendic anhydride, nadic anhydride, methylnadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalenesuccinic dianhydride, 1-methyl-dicarboxy-1,2,3,4-tetrahydro-1-naphthalenesuccinic dianhydride, and a mixture thereof.

According to an exemplary embodiment of the present invention, at least two types of the curing agents may be mixed.

The epoxy resin composition according to an exemplary embodiment of the present invention may further include a curing accelerator. The curing accelerator may be, for example, an amines curing accelerator, an imidazole curing accelerator, an organic phosphine curing accelerator, or a Lewis acid curing accelerator, and specifically, a tertiary amine such as 1,8-diazabicyclo(5,4,0)undecene-7, triethylenediamine, benzyldimethylamine, triethanolamine, dimethylaminoethanol, or tris(dimethylaminomethyl)phenol, an imidazole such as 2-methylimidazole, 2-phenylimidazole, 2-phenyl-4-methylimidazole or 2-heptadecylimidazole, an organic phosphine such as tributylphosphine, methyldiphenylphosphine, triphenylphosphine, diphenylphosphine or phenylphosphine, tetrasubstituted phosphonium.tetrasubstituted borate such as tetraphenylphosphonium.tetraphenylborate, tetraphenylphosphonium.ethyltriphenylborate or tetra-butylphosphonium.tetrabutylborate, or tetraphenylborate such as 2-ethyl-4-methylimidazole.tetraphenylborate or N-methyl-morpholine.tetraphenylborate.

Here, the boron nitride in which a surface is coated with a ceramic including at least two elements selected from the group consisting of C, N and O or a metal oxide including an alkoxide (—OR) group may be included at 30 to 39 wt %, and preferably, 32 to 37 wt %, with respect to a total weight of the epoxy resin composition. When the coated boron nitride is included at the above range, the epoxy resin composition may have a thermal conductivity of 16 W/mK or more, and a peel strength of 1 Kgf/cm or more.

Here, the boron nitride may be a boron nitride agglomerate in which planar boron nitrides agglomerate. The boron nitride agglomerate may have a density of 0.3 to 0.4 g/cm$^3$. When the boron nitride agglomerate is included as an inorganic filler, a through-plane thermal conductivity may increase, and thus a higher thermal conductivity than the planar boron nitride may be obtained. Here, when the boron nitride agglomerate has a density of more than 0.4 g/cm$^3$, a dispersity may be degraded. In addition, when the density of the boron nitride agglomerate is less than 0.3 g/cm$^3$, a higher thermal conductivity than that of the planar boron nitride may not be obtained.

In addition, the coating layer including SiCNO may be formed of polysilazane (PSZ) of Formula 1 as described above.

The metal oxide including an alkoxide (—OR) group, for example, aluminum oxide, silicon oxide or titanium oxide, may be formed by dehydrating condensation of aluminum alkoxide (Al alkoxide) of Formula 18, silicon alkoxide (Si alkoxide) of Formula 19, or titanium alkoxide (Ti alkoxide) of Formula 20, respectively.

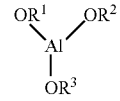

[Formula 18]

Here, $R^1$ to $R^3$ may be each selected from the group consisting of H and $C_1$~$C_6$ alkyl.

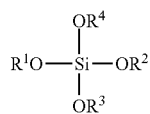
[Formula 19]

Here, $R^1$ to $R^4$ may be each selected from the group consisting of H and $C_1$~$C_6$ alkyl.

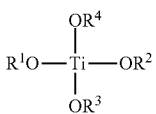
[Formula 20]

Here, $R^1$ to $R^4$ may be each selected from the group consisting of H and $C_1$~$C_6$ alkyl.

A mechanism of forming silicon oxide including an alkoxide group from silicon alkoxide is shown in the following reaction formula.

(a) Hydrolysis:

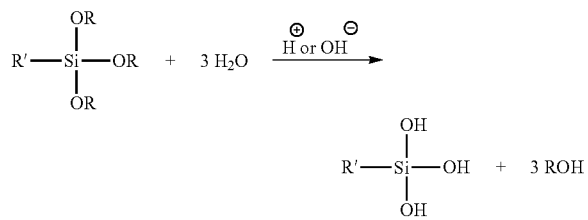

(b) Self-condensation:

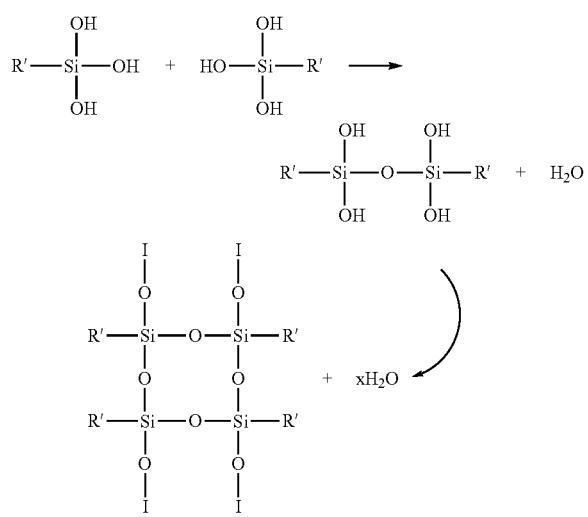

The method of coating the surface of the boron nitride is illustrated in FIGS. 1 and 2 as described above.

Here, when the boron nitride is a boron nitride agglomerate in which planar boron nitrides agglomerate, a void in the agglomerate may be filled with SiCNO. Likewise, when a void in the agglomerate is filled with a ceramic, thermal conducting performance may further increase.

In addition, according to an exemplary embodiment of the present invention, the inorganic filler may further include at least one of aluminum oxide and aluminum nitride. For example, with respect to 10 parts by weight of the boron nitride in which a surface is coated with SiCNO or a metal oxide, aluminum nitride may be included at 7.4 to 9.7 parts by weight, and aluminum oxide may be included at 5.6 to 7.4 parts by weight. When aluminum oxide and aluminum nitride are further included, the thermal conductivity and the peel strength may be further increased. When the aluminum oxide, the aluminum nitride and the boron nitride are contained at the above ratio, the epoxy resin composition may have a thermal conductivity of 16 W/mK or more and a peel strength of 1 Kgf/cm or more.

The epoxy resin composition according to an exemplary embodiment of the present invention may further include a catalyst, an additive and a solvent. The catalyst may include, for example, an imidazole-based additive shown in Formula 21.

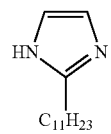
[Formula 21]

When the epoxy resin composition according to an exemplary embodiment of the present invention includes the catalyst of Formula 21, a cohesive property to a metal may increase. Accordingly, since an adhesive strength between the insulating layer and the circuit pattern consisting of copper increases and a detaching possibility and a disconnecting possibility decrease, the printed circuit board is easily processed and reliability of the printed circuit board increases.

Hereinafter, the present invention will be described in further detail with reference to examples and comparative examples.

Example II-1

A crystalline epoxy compound (4,4'-biphenol ether diglycidyl ether) at 11 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 29 wt % of boron nitride in which a surface was coated with SiCNO [here, the boron nitride in which a surface was coated with SiCNO (a thickness of the coating layer: 100 nm) was prepared by etching a surface of a boron nitride agglomerate in which planar boron nitrides agglomerated using an hydrofluoric (HF)-based solution, mixing the etched result with a polysilazane solution and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-1.

Example II-2

A crystalline epoxy compound (4,4'-biphenol ether diglycidyl ether) at 10 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 30 wt % of boron nitride in which a surface was coated with SiCNO [here, the boron nitride in which a surface was coated with SiCNO (a thickness of the coating layer: 100 nm) was prepared by etching a surface of a boron nitride agglomerate in which planar boron nitrides agglomerated using an HF-based solution, mixing the etched result with a polysilazane solution and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-2.

Example II-3

A crystalline epoxy compound (4,4'-biphenol ether diglycidyl ether) at 5 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 35 wt % of boron nitride in which a surface was coated with SiCNO [here, the boron nitride in which a surface was coated with SiCNO (a thickness of the coating layer: 100 nm) was prepared by etching a surface of a boron nitride agglomerate in which planar boron nitrides agglomerated using an HF-based solution, mixing the etched result with a polysilazane solution and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-3.

Example II-4

A crystalline epoxy compound (4,4'-biphenol ether diglycidyl ether) at 5 wt %, an amorphous epoxy compound of Formula 2 at 2 wt %, a silicon epoxy compound of Formula 3 in which R was a phenyl group at 2 wt %, 4,4'-diaminodiphenylsulfone at 0.5 wt % and an acid anhydride-based curing agent of Formula 4 at 0.5 wt % were dissolved in MEK for 20 minutes, and 39 wt % of boron nitride in which a surface was coated with SiCNO [here, the boron nitride in which a surface was coated with SiCNO (a thickness of the coating layer: 100 nm) was prepared by etching a surface of a boron nitride agglomerate in which planar boron nitrides agglomerated using an HF-based solution, mixing the etched result with a polysilazane solution and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-4.

Example II-5

A crystalline epoxy compound (4,4'-biphenol ether diglycidyl ether) at 4 wt %, an amorphous epoxy compound of Formula 2 at 2 wt %, a silicon epoxy compound of Formula 3 in which R was a phenyl group at 2 wt %, 4,4'-diaminodiphenylsulfone at 0.5 wt % and an acid anhydride-based curing agent of Formula 4 at 0.5 wt % were dissolved in MEK for 20 minutes, and 40 wt % of boron nitride in which a surface was coated with SiCNO [here, the boron nitride in which a surface was coated with SiCNO (a thickness of the coating layer: 100 nm) was prepared by etching a surface of a boron nitride agglomerate in which planar boron nitrides agglomerated using an HF-based solution, mixing the etched result with a polysilazane solution and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-5.

Example II-6

A crystalline epoxy compound (4,4'-biphenol ether diglycidyl ether) at 11 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 29 wt % of boron nitride in which a surface was coated with aluminum oxide having an —OR group (wherein R is $C_1$ alkyl) [here, the coated boron nitride was prepared by etching a surface of a boron nitride agglomerate in which planar boron nitrides agglomerated using an HF-based solution, mixing the etched result with an aluminum alkoxide solution (—OR, wherein R is $C_1$) and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-6.

Example II-7

A crystalline epoxy compound (4,4'-biphenol ether diglycidyl ether) at 10 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 30 wt % of boron nitride in which a surface was coated with aluminum oxide having an —OR group (wherein R is $C_1$ alkyl) [here, the coated boron nitride was prepared by etching a surface of a boron nitride agglomerate in which planar boron nitrides agglomerated using an HF-based solution, mixing the etched result with an aluminum alkoxide solution (—OR, wherein R is $C_1$) and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-7.

Example II-8

A crystalline epoxy compound (4,4'-biphenol ether diglycidyl ether) at 5 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 35 wt % of boron nitride in which a surface was coated with aluminum oxide having an —OR group (wherein R is $C_1$ alkyl) [here, the coated boron nitride was prepared by etching a surface of a boron nitride agglomerate in which planar boron nitrides agglomerated using an HF-based solution, mixing the etched result with an aluminum alkoxide solution (—OR, wherein R is $C_1$) and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-8.

Example II-9

A crystalline epoxy compound (4,4'-biphenol ether diglycidyl ether) at 5 wt %, an amorphous epoxy compound of Formula 2 at 2 wt %, a silicon epoxy compound of Formula 3 in which R was a phenyl group at 2 wt %, 4,4'-diaminodiphenylsulfone at 0.5 wt % and an acid anhydride-based curing agent of Formula 4 at 0.5 wt % were dissolved in MEK for 20 minutes, and 39 wt % of boron nitride in which a surface was coated with aluminum oxide having an —OR group (wherein R is $C_1$ alkyl) [here, the coated boron nitride was prepared by etching a surface of a boron nitride agglomerate in which planar boron nitrides agglomerated using an HF-based solution, mixing the etched result with an aluminum alkoxide solution (—OR, wherein R is $C_1$) and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-9.

Example II-10

A crystalline epoxy compound (4,4'-biphenol ether diglycidyl ether) at 4 wt %, an amorphous epoxy compound of Formula 2 at 2 wt %, a silicon epoxy compound of Formula 3 in which R was a phenyl group at 2 wt %, 4,4'-diaminodiphenylsulfone at 0.5 wt % and an acid anhydride-based curing agent of Formula 4 at 0.5 wt % were dissolved in MEK for 20 minutes, and 40 wt % of boron nitride in which a surface was coated with aluminum oxide having an —OR group (wherein R is $C_1$ alkyl) [here, the coated boron nitride was prepared by etching a surface of a boron nitride agglomerate in which planar boron nitrides agglomerated using an HF-based solution, mixing the etched result with an aluminum alkoxide solution (—OR, wherein R is $C_1$) and treating the resulting mixture at 160° C. for 18 hours, and pyrolyzing the resulting product at 800° C. for 3 hours], 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Example II-10.

Comparative Example II-1

A crystalline epoxy compound (4,4'-biphenol ether diglycidyl ether) at 11 wt %, an amorphous epoxy compound of Formula 2 at 4 wt %, a silicon epoxy compound of Formula 3 in which R was a phenyl group at 4 wt %, 4,4'-diaminodiphenylsulfone at 0.5 wt % and an acid anhydride-based curing agent of Formula 4 at 0.5 wt % were dissolved in MEK for 20 minutes, and 29 wt % of boron nitride (here, the boron nitride included a boron nitride agglomerate in which planar boron nitrides agglomerated), 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Comparative Example II-1.

Comparative Example II-2

A crystalline epoxy compound (4,4'-biphenol ether diglycidyl ether) at 6 wt %, an amorphous epoxy compound of Formula 2 at 3.5 wt %, a silicon epoxy compound of Formula 3 in which R was a phenyl group at 3.5 wt %, 4,4'-diaminodiphenylsulfone at 0.5 wt % and an acid anhydride-based curing agent of Formula 4 at 0.5 wt % were dissolved in MEK for 20 minutes, and 35 wt % of boron nitride (here, the boron nitride included a boron nitride agglomerate in which planar boron nitrides agglomerated), 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Comparative Example II-2.

Comparative Example II-3

A crystalline epoxy compound (4,4'-biphenol ether diglycidyl ether) at 4 wt %, an amorphous epoxy compound of Formula 2 at 2 wt %, a silicon epoxy compound of Formula 3 in which R was a phenyl group at 2 wt %, 4,4'-diaminodiphenylsulfone at 0.5 wt % and an acid anhydride-based curing agent of Formula 4 at 0.5 wt % were dissolved in MEK for 20 minutes, and 40 wt % of boron nitride (here, the boron nitride included a boron nitride agglomerate in which planar boron nitrides agglomerated), 29 wt % of aluminum nitride and 22 wt % of aluminum oxide were stirred for 2 hours. The solution in which the stirring was completed was coated on a copper plate, and pressed at 150° C. for one and a half hours, thereby obtaining an epoxy resin composition of Comparative Example II-3.

Experimental Example

The compositions obtained in Examples II-1 to II-10 and Comparative Examples II-1 to II-3 were cured, and then thermal conductivity was measured through a transient hot-wire method using an LFA447 Nanoflash (manufactured by NETZSCH). In addition, a peel strength was measured using an apparatus manufactured by YMTech in a vertical direction under conditions of a rate of 50 mm/min and the use of a copper layer having a thickness of 62.5 mm.

The measurement results are shown in Tables 4 and 5.

TABLE 4

| Test No. | Thermal conductivity (W/mK) | Peel strength (Kgf/cm) |
| --- | --- | --- |
| Example II-1 | 15.52 | 0.81 |
| Example II-2 | 16.16 | 1.01 |
| Example II-3 | 16.44 | 1.07 |
| Example II-4 | 16.39 | 1.03 |
| Example II-5 | 15.22 | 0.91 |

TABLE 4-continued

| Test No. | Thermal conductivity (W/mK) | Peel strength (Kgf/cm) |
| --- | --- | --- |
| Comparative Example II-1 | 10.90 | 0.33 |
| Comparative Example II-2 | 11.11 | 0.31 |
| Comparative Example II-3 | 11.27 | 0.25 |

TABLE 5

| Test No. | Thermal conductivity (W/mK) | Peel strength (Kgf/cm) |
| --- | --- | --- |
| Example II-6 | 14.99 | 0.75 |
| Example II-7 | 16.11 | 1.00 |
| Example II-8 | 16.31 | 1.04 |
| Example II-9 | 16.85 | 1.01 |
| Example II-10 | 15.67 | 0.86 |
| Comparative Example II-1 | 10.90 | 0.33 |
| Comparative Example II-2 | 11.11 | 0.31 |
| Comparative Example II-3 | 11.27 | 0.25 |

Referring to Tables 4 and 5, it can be noted that Examples II-1 to II-5 including an epoxy compound, a curing agent, and boron nitride in which a surface was coated with silicon oxycarbonitride as an inorganic filler, and Examples II-6 and II-10 including an epoxy compound, a curing agent, and boron nitride in which a surface was coated with a ceramic including —OR as an inorganic filler satisfied conditions in that a thermal conductivity was 14 W/mK or more and a peel strength was 0.7 Kgf/cm or more. Contrarily, it can be noted that Comparative Examples II-1 to II-3 in which the type and content of the inorganic filler were the same, but a surface of boron nitride was not coated with a ceramic had a low thermal conductivity of less than 12 W/mK, and a considerably low peel strength of 0.4 Kgf/cm or less.

In addition, it can be noted that the compositions of Examples II-2 to II-4 and Examples II-7 to II-9 including the boron nitride in which a surface was coated with a ceramic at 30 to 39 wt % as an inorganic filler with respect to a total weight of the epoxy resin composition, and including the aluminum nitride at 7.4 to 9.7 parts by weight and the aluminum oxide at 5.6 to 7.4 parts by weight with respect to 10 parts by weight of the boron nitride had a thermal conductivity of 16 W/mK or more and a peel strength of 1 Kgf/cm or more.

III. Inorganic Filler which is Agglomerate Having Void Filled with Ceramic

Meanwhile, an inorganic filler included in an epoxy resin composition according to an exemplary embodiment of the present invention may include an agglomerate in which planar inorganic particles agglomerate, and a ceramic including at least two elements selected from the group consisting of C, N and O may be formed in a void in the agglomerate.

Likewise, when the inorganic filler includes the agglomerate in which planar inorganic particles agglomerate, an isotropic thermal conductive property exhibiting uniform thermal conductivity in every direction may be obtained, and dispersity and insulability may also increase. Particularly, when the void in the agglomerate is filled, since an air layer in the agglomerate is minimized, the thermal conductivity may be increased, and a binding strength between the planar inorganic particles forming an agglomerate may be increased to prevent breakage of the agglomerate.

Here, the planar inorganic particles may include at least one of graphite and boron nitride (BN). In addition, the planar inorganic particles may include a hybrid filler in which each of the graphite and the boron nitride is present on a plane.

Meanwhile, the ceramic filled in the void in the agglomerate may include silicon oxycarbonitride (SiCNO) or silicon carbonitride (SiCN). Here, the SiCNO or SiCN may be formed of the polysilazane (PSZ) of Formula 1 as described above.

Alternatively, the ceramic filled in the void in the agglomerate may include at least one of aluminum oxide including an alkoxide group, a silicon oxide including an alkoxide group and titanium oxide including an alkoxide group. Here, as described above, the aluminum oxide may be formed by hydrolysis and dehydrating condensation of aluminum alkoxide (Al alkoxide), the silicon oxide may be formed by hydrolysis and dehydrating condensation of silicon alkoxide, and the titanium oxide may be formed by hydrolysis and dehydrating condensation of titanium alkoxide.

FIGS. 9 and 10 illustrate a method of filling a void of an agglomerate in which planar inorganic particles agglomerate according to an exemplary embodiment of the present invention. For convenience of explanation, the method is described provided that the planar inorganic particle is planar boron nitride, and the ceramic is SiCNO, but the present invention is not limited thereto.

Referring to FIGS. 9 and 10, a boron nitride agglomerate 1200 is mixed with polysilazane (S110). FIG. 11 shows a morphology of the boron nitride agglomerate 1200. When a surface of the boron nitride agglomerate 1200 of FIG. 11 is assayed by EDX analysis, B is included at 75.33 wt % and N is included at 24.67 wt %, and when a cross-section thereof is assayed by EDX analysis, B is included at 73.58 wt %, and N is included at 26.42a wt %. For example, the polysilazane may be a monomer or an oligomer, and 30 g of the polysilazane and 30 g of the boron nitride agglomerate 1200 may be stirred for 5 minutes, and then washed with a solvent, for example, acetone.

To this end, the boron nitride agglomerate 1200 may be previously etched using an HF-based solution. When the boron nitride agglomerate 1200 is etched, a reactivity to the polysilazane may be increased.

Accordingly, the liquid polysilazane may be filled in a void and on a surface of an boron nitride agglomerate 1210.

Subsequently, liquid polysilazane in the void and on the surface of the boron nitride agglomerate 1210 is polymerized (S1110). To this end, the boron nitride agglomerate 1210 may be treated at 160 to 180° C. for 18 to 24 hours. Accordingly, the polysilazane monomer or oligomer may be crosslinked through dehydrating condensation to fill a void or coat a surface of a boron nitride agglomerate 1220.

In addition, the boron nitride agglomerate 1220 is sintered (S1120). To this end, the boron nitride agglomerate 1220 may be pyrolyzed at 700 to 800° C. for 2 to 3 hours. According to the pyrolysis, $CH_4$, $C_2H_4$, $C_2H_6$, and $NH_3$ of a polysilazane polymer are emitted, and a boron nitride agglomerate 1230 in which a void and a surface are filled with an SiCNO ceramic may be obtained. FIG. 12 shows a morphology of the boron nitride agglomerate in which the void is filled with SiCNO. When the surface of the boron nitride agglomerate of FIG. 12 is assayed through EDX analysis, B is included at 50.23 wt %, C is included at 9.00 wt %, N is included at 7.56 wt %, O is included at 4.69 wt %, and Si is included at 28.53 wt %, and when the cross-section of the boron nitride agglomerate of FIG. 12 is assayed through EDX analysis, B is included at 53.40 wt %, C is included at 9.16 wt %, N is included at 12.14 wt %, O is included at 5.93 wt %, and Si is included at 19.38 wt %.

When the pyrolysis described in S1120 is performed in a nitrogen atmosphere, the void may be filled with a ceramic including SiCN.

Likewise, when a liquid ceramic precursor, for example, polysilazane, aluminum alkoxide, silicon alkoxide or titanium alkoxide, is mixed with a boron nitride agglomerate and heated, the liquid ceramic precursor permeates into a void of the boron nitride agglomerate and then is sintered into a ceramic, and thus it is easy to fill the void.

The epoxy resin composition according to an exemplary embodiment of the present invention may further include at least one selected from the group consisting of aluminum oxide, aluminum nitride, magnesium oxide and boron nitride.

Here, the epoxy resin composition according to an exemplary embodiment of the present invention may include an epoxy compound at 3 to 40 vol %, and preferably, 3 to 20 vol %, a curing agent at 0.5 to 10 vol %, and preferably, 0.5 to 5 vol %, and an inorganic filler including an agglomerate in which planar inorganic particles agglomerate, and in which a ceramic including at least two elements selected from the group consisting of C, N and O is formed in a void in the agglomerate at 50 to 95 vol %, and preferably, 75 to 95 vol %. When the epoxy compound, the curing agent, and the inorganic filler are included at the above ratio, the epoxy resin composition may have good thermal conductivity, room temperature stability and dispersity. Particularly, when the inorganic filler is included at more than 95 vol %, the content of the epoxy compound may relatively decrease, and a fine void may be formed between the inorganic filler and the epoxy compound, thereby rather decreasing the thermal conductivity. In addition, when the inorganic filler is included at less than 50 vol %, the thermal conductivity may also decrease.

Here, with respect to 10 parts by volume of the epoxy compound, the agglomerate in which planar inorganic particles agglomerate may be included at 10 to 60 parts by volume, preferably, 15 to 55 parts by volume, and more preferably, 45 to 55 parts by volume. When the epoxy compound and the agglomerate satisfy the above ratios, the epoxy resin composition may have high thermal conductivity and peel strength. Particularly, when the agglomerate is included at less than 10 parts by volume with respect to 10 parts by volume of the epoxy compound, the thermal conductivity may decrease. In addition, when the agglomerate is included at more than 60 parts by volume with respect to 10 parts by volume of the epoxy compound, a brittleness of the epoxy resin composition may increase, and thus the peel strength may decrease.

Here, the epoxy compound may include at least one of a crystalline epoxy compound, an amorphous epoxy compound and a silicon epoxy compound.

The crystalline epoxy compound may include a mesogen structure. The mesogen is a basic unit of a liquid crystal, and includes a rigid structure.

In addition, the amorphous epoxy compound may be a conventional amorphous epoxy compound having at least two epoxy groups in a molecule, for example, a glycidyl ether compound derived from bisphenol A or bisphenol F. The amorphous epoxy compound may be included at 3 to 40 parts by volume with respect to 10 parts by volume of the crystalline epoxy compound. When the crystalline epoxy compound and the amorphous epoxy compound are included at the above ratio, a room temperature stability may be increased.

In addition, the silicon epoxy compound may be included at 3 to 40 parts by volume with respect to 10 parts by volume of the crystalline epoxy compound. When the crystalline epoxy compound and the silicon epoxy compound are included at the above ratio, a thermal conductivity and a thermal resistance may be increased.

In addition, the curing agent included in the epoxy resin composition according to an exemplary embodiment of the present invention may include at least one of an amine-based curing agent, a phenol-based curing agent, an acid anhydride-based curing agent, a polymercaptan-based curing agent, a polyaminoamide-based curing agent, an isocyanate-based curing agent and a block isocyanate-based curing agent, and a mixture of at least two thereof.

Hereinafter, the present invention will be described in further detail with reference to examples and comparative examples.

Example III-1

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

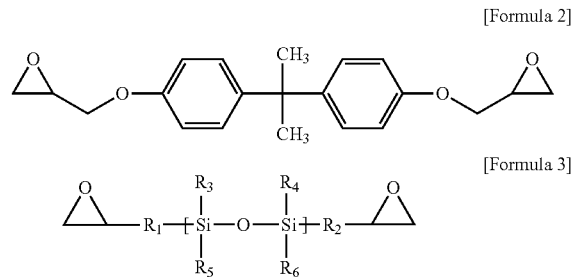

[Formula 2]

[Formula 3]

Here, $R^1$ to $R^6$ may be each selected from the group consisting of H, Cl, Br, F, $C_1$~$C_3$ alkyl, $C_1$~$C_3$ alkene, $C_1$~$C_3$ alkyne, and an aryl group. Here, $R^1$ to $R^6$ may be a phenyl group.

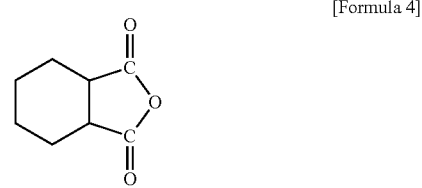 [SMILES: O=C1OC(=O)C2CCCCC12]

[Formula 4]

In addition, 26 vol % of alumina and 64 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm³, and a void ratio was 1% or less) were added, and stirred for 2 hours. The solution in which the stirring was completed was uniformly coated on a copper plate, and cured at 150° C. for one and a half hours under a constant pressure.

Example III-2

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 35 vol % of alumina and 55 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm$^3$, and a void ratio was 1% or less) were added, and stirred for 2 hours. The solution in which the stirring was completed was uniformly coated on a copper plate, and cured at 150° C. for one and a half hours under a constant pressure.

Example III-3

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 50 vol % of alumina and 40 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm$^3$, and a void ratio was 1% or less) were added, and stirred for 2 hours. The solution in which the stirring was completed was uniformly coated on a copper plate, and cured at 150° C. for one and a half hours under a constant pressure.

Example III-4

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 58 vol % of alumina and 32 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm$^3$, and a void ratio was 1% or less) were added, and stirred for 2 hours. The solution in which the stirring was completed was uniformly coated on a copper plate, and cured at 150° C. for one and a half hours under a constant pressure.

Example III-5

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 66 vol % of alumina and 24 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm$^3$, and a void ratio was 1% or less) were added, and stirred for 2 hours. The solution in which the stirring was completed was uniformly coated on a copper plate, and cured at 150° C. for one and a half hours under a constant pressure.

Example III-6

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 75 vol % of alumina and 16 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm$^3$, and a void ratio was 1% or less) were added, and stirred for 2 hours. The solution in which the stirring was completed was uniformly coated on a copper plate, and cured at 150° C. for one and a half hours under a constant pressure.

Example III-7

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 82 vol % of alumina and 8 vol % of boron nitride in which a void was filled with SiCNO (here, the boron nitride in which the void was filled with SiCNO was prepared by mixing a boron nitride agglomerate in which planar boron nitrides agglomerate d with polysilazane, treating the resulting mixture at 180° C. for 24 hours, and performing pyrolysis at 700° C. for 2 hours, an average density was 2.246 g/cm$^3$, and a void ratio was 1% or less) were added, and stirred for 2 hours. The solution in which the stirring was completed was uniformly coated on a copper plate, and cured at 150° C. for one and a half hours under a constant pressure.

Comparative Example III-1

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 26 vol % of alumina and 64 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Comparative Example III-2

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 35 vol % of alumina and 55 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Comparative Example III-3

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 50 vol % of alumina and 40 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Comparative Example III-4

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 58 vol % of alumina and 32 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Comparative Example III-5

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 66 vol % of alumina and 24 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Comparative Example III-6

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 74 vol % of alumina and 16 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Comparative Example III-7

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, 82 vol % of alumina and 8 vol % of boron nitride (here, the boron nitride was a boron nitride agglomerate in which planar boron nitrides agglomerated, an average density was 2.075 g/cm$^3$, and a void ratio was 8%) were added, and stirred for 2 hours. The solution in which the stirring was completed was uniformly coated on a copper plate, and cured at 150° C. for one and a half hours under a constant pressure.

Experimental Example

The epoxy resin compositions obtained in Examples III-1 to III-7 and Comparative Examples III-1 to III-7 were cured, and then a thermal conductivity was measured through a transient hot-wire method using an LFA447 Nanoflash (manufactured by NETZSCH). To this end, the epoxy resin composition was manufactured in a circular shape having a diameter of 0.5 inch, and then a thermal conductivity was calculated by exposing a top surface of the composition to a laser pulse with 247 voltage, and measuring a time to equilibrium at a bottom. In addition, the epoxy resin compositions obtained in Examples III-1 to III-7 and Comparative Examples III-1 to III-7 were cured, and a copper layer having a thickness of 62.5 mm was adhered, and then a peeling strength was measured by lifting the copper layer in a vertical direction (at an angle of 90 degrees) at a rate of 50 mm/min using an apparatus manufactured by YMTech.

The results are shown in Table 6.

TABLE 6

| Test No. | Thermal conductivity (W/mK) | Peel strength (Kgf/cm) |
|---|---|---|
| Example III-1 | 14.1 | 0.30 |
| Comparative Example III-1 | 13.4 | 0.28 |
| Example III -2 | 16.9 | 0.38 |
| Comparative Example III-2 | 16.8 | 0.31 |
| Example III -3 | 21.76 | 0.67 |
| Comparative Example III-3 | 20.1 | 0.5 |
| Example III-4 | 19.4 | 0.70 |
| Comparative Example III-4 | 17.7 | 0.54 |
| Example III-5 | 18 | 0.75 |
| Comparative Example III-5 | 16.53 | 0.60 |
| Example III-6 | 16.1 | 0.81 |
| Comparative Example III-6 | 13.8 | 0.65 |
| Example III-7 | 12.7 | 0.9 |
| Comparative Example III-7 | 10.85 | 0.74 |

Referring to Table 1, it can be noted that the epoxy resin composition of Example III-1 including the boron nitride agglomerate in which a void was filled with SiCNO as the inorganic filler had a higher thermal conductivity and a higher peel strength than the epoxy resin composition of Comparative Example III-1 including the boron nitride agglomerate in which a void was not filled with SiCNO as the inorganic filler.

Likewise, it can be noted that the epoxy resin compositions of Examples III-2 to III-7 including the boron nitride agglomerate in which a void was filled with SiCNO as the inorganic filler had a higher thermal conductivity and a higher peel strength than the epoxy resin compositions of Comparative Examples III-2 to III-7, which included the boron nitride agglomerate in which a void was not filled as the inorganic filler at the same contents.

Particularly, it can be noted that Examples III-3 to III-7 including the boron nitride agglomerate in which a void was filled with SiCNO at 10 to 60 parts by volume with respect to 10 parts by volume of the epoxy compound were increased in thermal conductivity by 8% or more than Comparative Examples III-3 to III-7 at the same contents. In addition, it can be noted that, according to Example III-3 including the boron nitride agglomerate in which a void is filled with SiCNO at 45 to 55 parts by volume with respect to 10 parts by volume of the epoxy compound, an epoxy resin composition having a thermal conductivity of 21 W/mK or more and a peel strength of 0.6 Kgf/cm or more can be obtained.

IV. Inorganic Filler in which Hydroxyl Group is Formed on Surface of Coating Layer Meanwhile, an inorganic filler included in the epoxy resin composition according to an exemplary embodiment of the present invention may include a coating layer formed on its surface, the coating layer may include a ceramic including at least two elements selected from the group consisting of C, N and O, and a hydroxyl group (—OH) may be formed on a surface of the coating layer.

Likewise, when the surface of the inorganic filler is coated with the ceramic including at least two elements selected from the group consisting of C, N and O, a dispersity, an insulability and a thermal conductivity may be increased. Particularly, when the hydroxyl group (—OH) is formed on a surface of the coating layer, an adhesive strength between the epoxy resin and the inorganic filler may be increased, thereby increasing a dispersity, a thermal conductivity and a peel strength.

Here, the inorganic filler may include at least one of silicon carbide (SiC), boron nitride (BN), graphite, aluminum oxide ($Al_2O_3$) and aluminum nitride (AlN). Here, the inorganic filler may include an agglomerate in which planar boron nitrides or planar graphites agglomerate, and a ceramic including at least two elements selected from the group consisting of C, N and O may be formed in a void in the agglomerate.

Meanwhile, the ceramic including at least two elements selected from the group consisting of C, N and O may be formed of the polysilazane (PSZ) of Formula 1 as described above.

In addition, the ceramic may include at least one of aluminum oxide including an alkoxide group (—OR), silicon oxide including an alkoxide group and titanium oxide including an alkoxide group. Here, as described above, the aluminum oxide may be formed by hydrolysis and dehydrating condensation of aluminum alkoxide (Al alkoxide), the silicon oxide may be formed by hydrolysis and dehydrating condensation of silicon alkoxide, and the titanium oxide may be formed by hydrolysis and dehydrating condensation of titanium alkoxide.

FIGS. 13 to 14 illustrate a method of treating a surface of an inorganic filler according to an example of the present invention. For convenience of explanation, the present invention will be described provided that the inorganic filler is an agglomerate of planar boron nitrides, and the ceramic is SiCNO, but the present invention is not limited thereto. S1100 to S1120 of FIGS. 13 and 14 are the same as those of FIGS. 9 and 10, and thus the duplicated descriptions will be omitted.

Referring to FIGS. 13 and 14, a boron nitride agglomerate 1230 sintered in S1120 is pyrolyzed in an NaOH solution for 20 to 40 hours (S1130). Accordingly, a boron nitride agglomerate 1240 in which a hydroxyl group is formed on a surface may be obtained. That is, SiCNO is formed on a surface of the boron nitride agglomerate 1230 like the boron nitride agglomerate 1230 of FIG. 14. The SiCNO is an amorphous ceramic, and binds in a structure of —Si—O—Si—. Here, when the boron nitride agglomerate is treated in the NaOH solution, OH— breaks the bond between Si and O and reacts with Si, thereby forming the bond of Si—OH. According to such a process, a hydroxyl group may be formed on the surface of the boron nitride agglomerate coated with SiCNO.

Here, in the epoxy resin composition according to an exemplary embodiment of the present invention, the epoxy compound and the inorganic filler may be included in a volume ratio of 10:10 to 50, preferably, 10:25 to 50, and more preferably, 10:40 to 50. When the inorganic filler is included at less than 10 parts by volume with respect to 10 parts by volume of the epoxy compound, thermal conductivity may decrease. In addition, when the inorganic filler is included at more than 50 parts by volume with respect to 10 parts by volume of the epoxy compound, the brittleness of the epoxy resin composition may increase, and thus a peel strength may decrease.

Here, the epoxy compound may include at least one of a crystalline epoxy compound, an amorphous epoxy compound and a silicon epoxy compound.

The crystalline epoxy compound may include a mesogen structure. The mesogen is a basic unit of a liquid crystal, and includes a rigid structure.

In addition, the amorphous epoxy compound may be a conventional amorphous epoxy compound having at least two epoxy groups in a molecule, and may be, for example, a glycidyl ether compound derived from bisphenol A or bisphenol F. The amorphous epoxy compound may be included at 3 to 40 parts by volume with respect to 10 parts by volume of the crystalline epoxy compound. When the crystalline epoxy compound and the amorphous epoxy compound are included at the above ratio, a room temperature stability may be increased.

In addition, the silicon epoxy compound may be included at 3 to 40 parts by volume with respect to 10 parts by volume of the crystalline epoxy compound. When the crystalline epoxy compound and the silicon epoxy compound are included at the above ratio, a thermal conductivity and a thermal resistance may be increased.

In addition, the epoxy resin composition according to an exemplary embodiment of the present invention may further include a curing agent. The curing agent may be included at 0.5 to 5 vol % with respect to a total volume of the epoxy resin composition. The curing agent included in the epoxy resin composition according to an exemplary embodiment of the present invention may include at least one of an amine-based curing agent, a phenol-based curing agent, an acid anhydride-based curing agent, a polymercaptan-based curing agent, a polyaminoamide-based curing agent, an isocyanate-based curing agent and a block isocyanate-based curing agent, and a mixture of at least two thereof.

The epoxy resin composition according to an exemplary embodiment of the present invention may be applied to a printed circuit board. FIG. 15 is a cross-sectional view of the printed circuit board according to the exemplary embodiment of the present invention.

Referring to FIG. 15, a printed circuit board 100 includes a substrate 110, an insulating layer 120 and a circuit pattern 130.

The substrate 110 may consist of copper, aluminum, nickel, gold, platinum and an alloy thereof.

The insulating layer 120 consisting of the epoxy resin composition according to the exemplary embodiment of the present invention is formed on the substrate 110.

The circuit pattern 130 is formed on the insulating layer 120. The circuit pattern 130 may consist of a metal such as copper or nickel.

The insulating layer 120 insulates between the metal plate 110 and the circuit pattern 130.

The epoxy resin composition including the inorganic filler according to the exemplary embodiment of the present invention may also be applied to a light emitting element module. FIG. 16 is a cross-sectional view of a light emitting element module according to an exemplary embodiment of the present invention.

Referring to FIG. 16, a light emitting element module 400 includes a substrate 410, an insulating layer 420 formed on the substrate 410, a circuit pattern 430 formed on the insulating layer 420 and a light emitting element 440 formed on the insulating layer 420.

The substrate 410 may consist of copper, aluminum, nickel, gold, platinum and an alloy thereof.

The insulating layer 420 may include an epoxy resin composition including an inorganic filler according to an exemplary embodiment of the present invention.

Although not shown in FIG. 16, to increase a cohesive strength between the insulating layer 420 and the circuit pattern 430, a seed layer may be formed between the insulating layer 420 and the circuit pattern 430. Hereinafter, the present invention will be described in further detail with reference to examples and comparative examples.

First, epoxy resin compositions were prepared using an epoxy compound and an inorganic filler at the same content ratio, but with different types of inorganic fillers.

Example IV-1

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

[Formula 2]

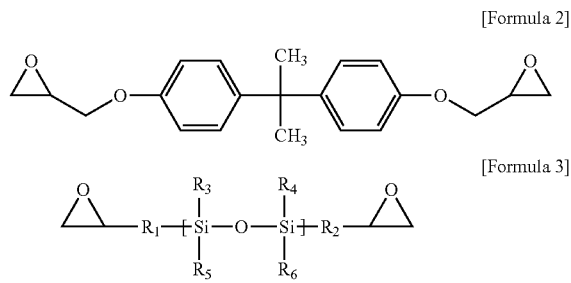

[Formula 3]

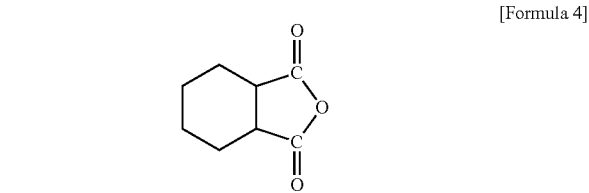 [SMILES: O=C1OC(=O)C2CCCCC12]

Here, $R^1$ to $R^6$ may be each selected from the group consisting of H, Cl, Br, F, $C_1$~$C_3$ alkyl, $C_1$~$C_3$ alkene, $C_1$~$C_3$ alkyne, and an aryl group. Here, $R^1$ to $R^6$ may be a phenyl group.

[Formula 4]

In addition, a coating layer including SiCNO was coated on a surface of SiC to a thickness of 100 nm, and 80 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Example IV-2

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 80 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Example IV-3

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of Al₂O₃ to a thickness of 100 nm, and 80 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Example IV-4

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of AlN to a thickness of 100 nm, and 80 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Comparative Example IV-1

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, 80 vol % of an inorganic filler formed by coating a coating layer including SiCNO on a surface of SiC to a thickness of 100 nm was added, and stirred for 2 hours. The solution in which the stirring was completed was uniformly coated on a copper plate, and cured at 150° C. for one and a half hours under a constant pressure.

Comparative Example IV-2

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, 80 vol % of an inorganic filler formed by coating a coating layer including SiCNO on a surface of BN (an agglomerate in which planar BNs agglomerate d, an average density was 2.246 g/cm³, and a void ratio was 8% or less) to a thickness of 100 nm was added, and stirred for 2 hours. The solution in which the stirring was completed was uniformly coated on a copper plate, and cured at 150° C. for one and a half hours under a constant pressure.

Comparative Example IV-3

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, 80 vol % of an inorganic filler formed by coating a coating layer including SiCNO on a surface of Al₂O₃ to a thickness of 100 nm was added, and stirred for 2 hours. The solution in which the stirring was completed was uniformly coated on a copper plate, and cured at 150° C. for one and a half hours under a constant pressure.

Comparative Example IV-4

A crystalline epoxy compound, that is, 4,4'-biphenol ether diglycidyl ether at 8.75 vol %, an amorphous epoxy compound of Formula 2 at 4.375 vol % and a silicon epoxy compound of Formula 3 at 4.375 vol %, 4,4'-diaminodiphenylsulfone at 1.25 vol % and an acid anhydride-based curing agent of Formula 4 at 1.25 vol % were mixed.

In addition, 80 vol % of an inorganic filler formed by coating a coating layer including SiCNO on a surface of AlN to a thickness of 100 nm was added, and stirred for 2 hours. The solution in which the stirring was completed was uniformly coated on a copper plate, and cured at 150° C. for one and a half hours under a constant pressure.

Afterward, epoxy resin compositions were prepared using the same type of an inorganic filler as used in Example IV-2, and epoxy compounds and inorganic fillers at different content ratios.

Example IV-5

A crystalline epoxy compound, that is, 4,4'-biphenol ether diglycidyl ether at 18.75 vol %, an amorphous epoxy compound of Formula 2 at 9.375 vol % and a silicon epoxy compound of Formula 3 at 9.375 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 60 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Example IV-6

A crystalline epoxy compound, that is, 4,4'-biphenol ether diglycidyl ether at 13.75 vol %, an amorphous epoxy compound of Formula 2 at 6.875 vol % and a silicon epoxy compound of Formula 3 at 6.875 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 70 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Example IV-7

A crystalline epoxy compound, that is, 4,4'-biphenol ether diglycidyl ether at 11.25 vol %, an amorphous epoxy compound of Formula 2 at 5.625 vol % and a silicon epoxy compound of Formula 3 at 5.625 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 75 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Comparative Example IV-5

A crystalline epoxy compound, that is, 4,4'-biphenol ether diglycidyl ether at 38.75 vol %, an amorphous epoxy compound of Formula 2 at 19.375 vol % and a silicon epoxy compound of Formula 3 at 19.375 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 20 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Comparative Example IV-6

A crystalline epoxy compound, that is, 4,4'-biphenol ether diglycidyl ether at 33.75 vol %, an amorphous epoxy compound of Formula 2 at 16.875 vol % and a silicon epoxy compound of Formula 3 at 16.875 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 30 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Comparative Example IV-7

A crystalline epoxy compound, that is, 4,4'-biphenol ether diglycidyl ether at 28.75 vol %, an amorphous epoxy compound of Formula 2 at 14.375 vol % and a silicon epoxy compound of Formula 3 at 14.375 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 40 vol % of an inorganic filler treated in NaOH for 36 hours wad added, and stirred for 2 hours. The solution in which the stirring was completed was uniformly coated on a copper plate, and cured at 150° C. for one and a half hours under a constant pressure.

Comparative Example IV-8

A crystalline epoxy compound, that is, 4,4'-biphenol ether diglycidyl ether at 3.75 vol %, an amorphous epoxy compound of Formula 2 at 1.875 vol % and a silicon epoxy compound of Formula 3 at 1.875 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 90 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Comparative Example IV-9

A crystalline epoxy compound, that is, 4,4'-biphenol ether diglycidyl ether at 6.25 vol %, an amorphous epoxy compound of Formula 2 at 3.125 vol % and a silicon epoxy compound of Formula 3 at 3.125 vol %, 4,4'-diaminodiphenylsulfone at 1.25 vol % and an acid anhydride-based curing agent of Formula 4 at 1.25 vol % were mixed.

In addition, a coating layer including SiCNO was coated on a surface of BN (an agglomerate in which planar BNs agglomerated, an average density was 2.246 g/cm³, and a void ratio was 8% or less) to a thickness of 100 nm, and 85 vol % of an inorganic filler treated in NaOH for 36 hours was added, and stirred for 2 hours. The solution in which the stirring was completed was uniformly coated on a copper plate, and cured at 150° C. for one and a half hours under a constant pressure.

Experimental Example

The epoxy resin compositions obtained in Examples IV-1 to IV-7 and Comparative Examples IV-1 to IV-9 were cured and manufactured in a circular shape having a diameter of 0.5 inches, and then thermal conductivity was calculated by exposing a top surface of the composition to a laser pulse with 247 voltage, and measuring a time to equilibrium at a bottom. In addition, the epoxy resin compositions obtained in Examples IV-1 to IV-5 and Comparative Examples IV-1 to IV-8 were cured, and a copper layer having a thickness of 62.5 mm was adhered, and then a peeling strength was measured by lifting the copper layer in a vertical direction (at an angle of 90 degrees) at a rate of 50 mm/min.

The results are shown in Tables 7 to 11.

TABLE 7

| Test No. | Thermal conductivity (W/mK) | Peel strength (Kgf/cm²) |
| --- | --- | --- |
| Example IV-1 | 14.56 | 1.69 |
| Comparative Example IV-1 | 13.63 | 1.42 |

TABLE 8

| Test No. | Thermal conductivity (W/mK) | Peel strength (Kgf/cm$^2$) |
|---|---|---|
| Example IV-2 | 17.42 | 1.2 |
| Comparative Example IV-2 | 15.4 | 0.57 |

TABLE 9

| Test No. | Thermal conductivity (W/mK) | Peel strength (Kgf/cm$^2$) |
|---|---|---|
| Example IV-3 | 11.78 | 1.72 |
| Comparative Example IV-3 | 9.33 | 1.5 |

TABLE 10

| Test No. | Thermal conductivity (W/mK) | Peel strength (Kgf/cm$^2$) |
|---|---|---|
| Example IV-4 | 13.46 | 0.8 |
| Comparative Example IV-4 | 12.16 | 0.48 |

TABLE 11

| Test No. | Thermal conductivity (W/mK) | Peel strength (Kgf/cm$^2$) |
|---|---|---|
| Example IV-2 | 17.42 | 1.2 |
| Example IV-5 | 14.2 | 0.6 |
| Example IV-6 | 13.6 | 0.8 |
| Example IV-7 | 14.3 | 0.71 |
| Comparative Example IV-5 | 6.29 | 1.46 |
| Comparative Example IV-6 | 9.55 | 1.28 |
| Comparative Example IV-7 | 11.84 | 0.95 |
| Comparative Example IV-8 | 17 | 0.2 |
| Comparative Example IV-9 | 16 | 0.33 |

Referring to Table 7, it can be noted that Example IV-1 including the inorganic filler in which a surface was coated with SiCNO and treated in an NaOH solution to add a hydroxyl group exhibited higher thermal conductivity and peel strength than Comparative Example IV-1 including the inorganic filler in which a surface was coated with SiCNO and not treated in an NaHO solution at the same content as Example IV-1.

Likewise, referring to Tables 8 to 10, it can be noted that Examples IV-2 to IV-4 including the inorganic filler in which a surface was coated with SiCNO and treated in an NaOH solution to add a hydroxyl group exhibited higher thermal conductivity and peel strength than Comparative Examples IV-2 to IV-4 including the inorganic filler in which a surface was coated with SiCNO and not treated in an NaHO solution at the same content as Examples IV-2 to IV-4, respectively.

Meanwhile, referring to Table 11, as described in Example IV-2 and IV-5 to IV-7, it can be noted that when an epoxy compound and an inorganic filler according to an exemplary embodiment of the present invention are included in a volume ratio of 10:10 to 50, an epoxy resin composition having high thermal conductivity and peel strength may be obtained. That is, as described in Comparative Examples IV-5 to IV-7, it can be noted that when an inorganic filler is included in at less than 10 parts by volume with respect to 10 parts by volume of an epoxy compound, a peel strength is high but a thermal conductivity is considerably low. In addition, as described in Comparative Examples IV-8 to IV-9, it can be noted that when an inorganic filler is included at more than 50 parts by volume with respect to 10 parts by volume of an epoxy compound, a thermal conductivity is excellent, but due to a brittleness, a peel strength is very low.

Particularly, as described in Example IV-2, it can be noted that when an epoxy compound and an inorganic filler according to an exemplary embodiment of the present invention are included at a volume ratio of 10:40 to 50, an epoxy resin composition having a peel strength of 1 Kgf/cm or more and a thermal conductivity of 17 W/mK or more may be obtained.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

The invention claimed is:

1. An inorganic filler, comprising:
a boron nitride agglomerate and a coating layer formed on a surface of the agglomerate,
wherein the coating layer comprises a material comprising Si, C and N, and a hydroxyl group (—OH) is formed on a surface of the coating layer,
wherein the boron nitride agglomerate is an agglomerate of planar boron nitride particles,
wherein pores are formed among the planar boron nitride particles in the boron nitride agglomerate,
wherein at least some of the pores are filled with the material comprising Si, C and N,
wherein the hydroxyl group (—OH) is further formed on the material filling the at least some of the pores, and
wherein at least one of the coating layer and the material filling the at least some of the pores comprise silicon oxycarbonitride (SiCNO) or silicon carbonitride (SiCN).

2. The filler of claim 1, wherein the coating layer has a thickness of 50 nm to 150 nm.

3. The filler of claim 1, wherein the hydroxyl group binds to the Si of the coating layer.

4. An epoxy resin composition, comprising:
an epoxy compound, a curing agent, and an inorganic filler,
wherein the inorganic filler comprises a boron nitride agglomerate and a coating layer formed on a surface of the boron nitride agglomerate, and the coating layer comprises a material comprising Si, C and N, and a hydroxyl group (—OH) is formed on a surface of the coating layer,
wherein the boron nitride agglomerate is an agglomerate of planar boron nitride particles,
wherein pores are formed among the planar boron nitride particles in the boron nitride agglomerate,
wherein at least some of the pores are filled with the material comprising Si, C and N,
wherein the hydroxyl group (—OH) is further formed on the material filling the at least some of the pores, and
wherein the coating layer and the material filling at least some of the pores comprise silicon oxycarbonitride (SiCNO) or silicon carbonitride (SiCN).

5. A printed circuit board, comprising:
an insulating layer; and a circuit pattern formed on the insulating layer, wherein the insulating layer comprises an epoxy resin composition, which comprises an epoxy compound, a curing agent and an inorganic filler, the inorganic filler comprises a boron nitride agglomerate and a coating layer formed on a surface of the boron nitride agglomerate, the coating layer comprises a material comprising Si, C and N, and a hydroxyl group (—OH) is formed on a surface of the coating layer, wherein the boron nitride agglomerate is an agglomerate of planar boron nitride particles, wherein pores are formed among the planar boron nitride particles in the boron nitride agglomerate, wherein at least some of the pores are filled with the material comprising Si, C and N, wherein the hydroxyl group (—OH) is further formed on the material filling the at least some of the pores, wherein the coating layer and the material filling the at least some of the pores comprise silicon oxycarbonitride (SiCNO) or silicon carbonitride (SiCN).

* * * * *